(12) United States Patent  (10) Patent No.: US 12,471,206 B2
Hanaoka                    (45) Date of Patent:     Nov. 11, 2025

(54) RADIO FREQUENCY MODULE AND COMMUNICATION DEVICE

(71) Applicant: Murata Manufacturing Co., Ltd., Kyoto (JP)

(72) Inventor: Kunitoshi Hanaoka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 280 days.

(21) Appl. No.: 18/307,153

(22) Filed: Apr. 26, 2023

(65) Prior Publication Data

US 2023/0319983 A1    Oct. 5, 2023

Related U.S. Application Data

(63) Continuation of application No. PCT/JP2021/036128, filed on Sep. 30, 2021.

(30) Foreign Application Priority Data

Dec. 14, 2020   (JP) .................................. 2020-207014

(51) Int. Cl.
   *H05K 1/02*    (2006.01)
   *H03H 9/13*    (2006.01)
   *H03H 9/54*    (2006.01)

(52) U.S. Cl.
   CPC ............ *H05K 1/0243* (2013.01); *H03H 9/13* (2013.01); *H03H 9/54* (2013.01); *H05K 2201/1006* (2013.01)

(58) Field of Classification Search
   CPC ......... H05K 1/0243; H05K 2201/1006; H03H 9/13; H03H 9/54

(Continued)

(56) References Cited

U.S. PATENT DOCUMENTS

2009/0091904 A1*  4/2009  Hatanaka .............. H01L 23/552
                                              361/764
2015/0119104 A1*  4/2015  Saji ........................ H04B 1/525
                                              455/553.1

(Continued)

FOREIGN PATENT DOCUMENTS

JP    2005-244336 A    9/2005
JP    2007-266840 A    10/2007

(Continued)

OTHER PUBLICATIONS

International Search Report for PCT/JP2021/036128 dated Dec. 21, 2021.

*Primary Examiner* — Binh B Tran
(74) *Attorney, Agent, or Firm* — McDonald Hopkins LLC

(57) ABSTRACT

To improve isolation among a plurality of electronic components. A radio frequency module includes a mounting substrate, a first electronic component and a second electronic component, a metal member, a first metal layer, a resin layer, and a second metal layer. The metal member is disposed between the first electronic component and the second electronic component on a first main surface of the mounting substrate. The first metal layer is disposed on the first main surface of the mounting substrate. The second metal layer covers at least a part of the resin layer. The first metal layer has a ground potential, and is in contact with the second metal layer. The metal member is in contact with the first metal layer and the second metal layer.

11 Claims, 13 Drawing Sheets

(58) Field of Classification Search
USPC .......................................................... 361/760
See application file for complete search history.

(56) References Cited

U.S. PATENT DOCUMENTS

| | | | |
|---|---|---|---|
| 2016/0142041 A1 | 5/2016 | Kuwahara | |
| 2018/0092257 A1 | 3/2018 | Otsubo et al. | |
| 2019/0159332 A1* | 5/2019 | Ishibashi | H05K 1/021 |
| 2020/0281102 A1 | 9/2020 | Otsubo et al. | |
| 2022/0053631 A1* | 2/2022 | Kang | H05K 9/0022 |

FOREIGN PATENT DOCUMENTS

| | | |
|---|---|---|
| JP | 2015-111748 A | 6/2015 |
| JP | 2016-096439 A | 5/2016 |
| WO | 2007/114224 A1 | 10/2007 |
| WO | 2016/181954 A1 | 11/2016 |
| WO | 2019/098316 A1 | 5/2019 |

* cited by examiner

RADIO FREQUENCY MODULE AND COMMUNICATION DEVICE

CROSS REFERENCE TO RELATED APPLICATION

This is a continuation of International Application No. PCT/JP2021/036128 filed on Sep. 30, 2021 which claims priority from Japanese Patent Application No. 2020-207014 filed on Dec. 14, 2020. The contents of these applications are incorporated herein by reference in their entireties.

BACKGROUND ART

Technical Field

The present disclosure generally relates to a radio frequency module and a communication device, and more particularly, to a radio frequency module including a mounting substrate and a communication device including the radio frequency module.

Patent Document 1 discloses a radio frequency module including a wiring substrate (mounting substrate), a plurality of electronic components (a first electronic component and a second electronic component) mounted on an upper surface of the wiring substrate, a sealing resin layer (resin layer) laminated on the upper surface of the wiring substrate, and a shield wall (metal member) provided on the sealing resin layer. The shield wall is provided among the plurality of electronic components.

Patent Document 1: International Publication No. 2016/181954

BRIEF SUMMARY

In a radio frequency module described in Patent Document 1, there may be a case where the shield wall provided among the plurality of electronic components (between the first electronic component and the second electronic component) cannot sufficiently ensure isolation among the plurality of electronic components.

The present disclosure provides a radio frequency module and a communication device that are capable of improving isolation among a plurality of electronic components.

A radio frequency module according to an aspect of the present disclosure includes a mounting substrate, a first electronic component and a second electronic component, a metal member, a first metal layer, a resin layer, and a second metal layer. The mounting substrate includes a first main surface and a second main surface that are opposed to each other. The first electronic component and the second electronic component are mounted on the first main surface of the mounting substrate. The metal member is disposed between the first electronic component and the second electronic component on the first main surface of the mounting substrate. The first metal layer is disposed on the first main surface of the mounting substrate. The resin layer is disposed on the first main surface of the mounting substrate. The second metal layer covers at least a part of the resin layer. The resin layer covers at least a part of the first electronic component, at least a part of the second electronic component, an outer peripheral surface of the metal member, and the first metal layer. The first metal layer has a ground potential and is in contact with the second metal layer. The metal member is in contact with the first metal layer and the second metal layer.

A communication device according to an aspect of the present disclosure includes the radio frequency module and a signal processing circuit. The signal processing circuit is connected to the radio frequency module.

According to the radio frequency module and the communication device according to an aspect of the present disclosure, it is possible to improve isolation among the plurality of electronic components.

DETAILED DESCRIPTION

Each of FIG. 1 to FIG. 3 and FIG. 5 to FIG. 13 referred to in the following embodiments and the like is a schematic diagram, and each ratio of sizes or thicknesses of the constituent elements in the diagram does not necessarily reflect the actual dimensional ratio.

Embodiment 1

Figure 2:
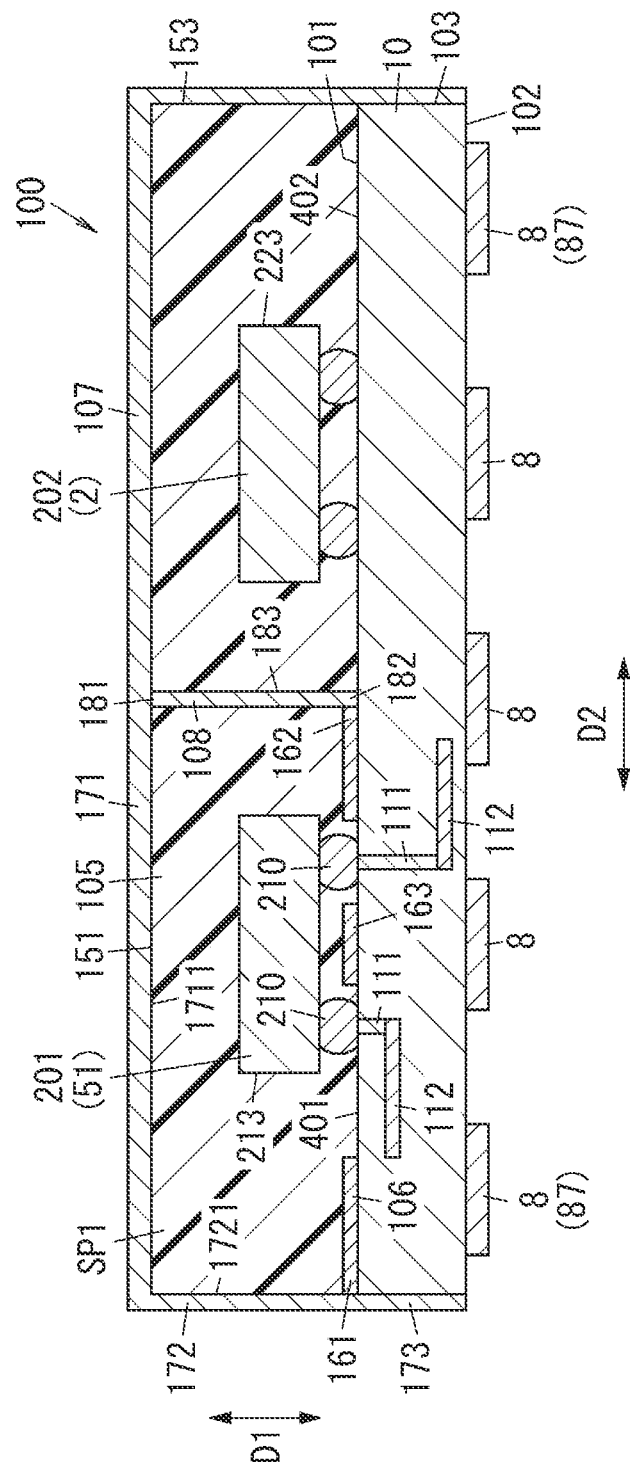
FIG. 2 is a cross-sectional view of the radio frequency module described above.

As illustrated in FIG. 2, a radio frequency module 100 according to Embodiment 1 includes a mounting substrate 10, a first electronic component 201 and a second electronic component 202, a metal member 108, a first metal layer 106, a resin layer 105, and a second metal layer 107. The mounting substrate 10 includes a first main surface 101 and a second main surface 102 that are opposed to each other. The first electronic component 201 and the second electronic component 202 are mounted on the first main surface 101 of the mounting substrate 10. The metal member 108 is disposed between the first electronic component 201 and the second electronic component 202 on the first main surface 101 of the mounting substrate 10. The first metal layer 106 is disposed on the first main surface 101 of the mounting substrate 10. The resin layer 105 is disposed on the first main surface 101 of the mounting substrate 10. The second metal layer 107 covers at least a part of the resin layer 105. The resin layer 105 covers at least a part of the first electronic component 201, at least a part of the second electronic component 202, an outer peripheral surface 183 of the metal member 108, and the first metal layer 106. The first metal layer 106 has a ground potential and is in contact with the second metal layer 107. The metal member 108 is in contact with the first metal layer 106 and the second metal layer 107.

In the radio frequency module 100 according to Embodiment 1, as described above, the first metal layer 106 disposed on the first main surface 101 of the mounting substrate 10 is in contact with the second metal layer 107. Further, in the radio frequency module 100 according to Embodiment 1, as described above, the metal member 108 disposed between the first electronic component 201 and the second electronic component 202 is in contact with the first metal layer 106 and the second metal layer 107. That is, in the radio frequency module 100 according to Embodiment 1, the metal member 108, the first metal layer 106, and the second metal layer 107 are in contact with each other. Thus, compared to a case where the metal member is in contact with only the second metal layer, the effect of noise suppression by the metal member 108 can be enhanced, and isolation between the first electronic component 201 and the second electronic component 202 can be improved. As a result, characteristic deterioration of each of the first electronic component 201 and the second electronic component 202 can be suppressed.

Hereinafter, the radio frequency module 100 and the communication device 300 according to Embodiment 1 will be described in more detail with reference to FIG. 1 to FIG. 4.

(1) Radio Frequency Module and Communication Device (1.1) Circuit Configuration of Radio Frequency Module and Communication Device First, a circuit configuration of the radio frequency module 100 and the communication device 300 according to Embodiment 1 will be described with reference to FIG. 4.

The radio frequency module 100 is used in, for example, the communication device 300. The communication device 300 is, for example, a mobile phone (for example, a smartphone), but is not limited to being a mobile phone, and may be, for example, a wearable terminal (for example, a smartwatch). The radio frequency module 100 is a module compatible with, for example, 4th generation mobile communication (4G) standards, 5th generation mobile communication (5G) standards, or the like. Examples of the 4G standards include the Third Generation Partnership Project (3GPP) Long Term Evolution (LTE) standards. Examples of the 5G standards include 5G New Radio (NR). The radio frequency module 100 is, for example, a module capable of supporting carrier aggregation and dual connectivity.

The radio frequency module 100 is capable of supporting simultaneous communication that simultaneously uses a plurality of (two in Embodiment 1) frequency bands (a first frequency band and a second frequency band) on an uplink. The radio frequency module 100 is configured such that a transmission signal (radio frequency signal) in the first frequency band input from a signal processing circuit 301 can be amplified by a first power amplifier 1 to be output to a first antenna 311. Additionally, the radio frequency module 100 is configured such that a transmission signal (radio frequency signal) in the second frequency band input from the signal processing circuit 301 can be amplified by a second power amplifier 2 to be output to a second antenna 312. In addition, the radio frequency module 100 further includes a low-noise amplifier 9, and is configured such that a reception signal (radio frequency signal) in the first frequency band input from the first antenna 311 is amplified by the low-noise amplifier 9 to be output to the signal processing circuit 301. The signal processing circuit 301 is not a constituent element of the radio frequency module 100, but a constituent element of the communication device 300 including the radio frequency module 100. The radio frequency module 100 is controlled by, for example, the signal processing circuit 301 included in the communication device 300. The communication device 300 includes the radio frequency module 100 and the signal processing circuit 301. The communication device 300 further includes the first antenna 311 and the second antenna 312. The communication device 300 further includes a circuit board (not illustrated) on which the radio frequency module 100 is mounted. The circuit board is, for example, a printed wiring board. The circuit board includes a ground electrode to which a ground potential is applied.

The signal processing circuit 301 includes, for example, an RF signal processing circuit 302 and a baseband signal processing circuit 303. The RF signal processing circuit 302 is, for example, a radio frequency integrated circuit (RFIC). The RF signal processing circuit 302 performs signal processing on a radio frequency signal. For example, the RF signal processing circuit 302 performs signal processing such as up-conversion on a radio frequency signal (transmission signal) output from the baseband signal processing circuit 303, and outputs the radio frequency signal subjected to the signal processing to the radio frequency module 100. In addition, for example, the RF signal processing circuit 302 performs signal processing such as down-conversion on a radio frequency signal (reception signal) output from the radio frequency module 100, and outputs the radio frequency signal subjected to the signal processing to the baseband signal processing circuit 303. The baseband signal processing circuit 303 is, for example, a baseband integrated circuit (BBIC). The baseband signal processing circuit 303 generates an I-phase signal and a Q-phase signal from a baseband signal. The baseband signal is, for example, an audio signal, an image signal, or the like input from the outside. The baseband signal processing circuit 303 performs IQ modulation processing by combining the I-phase signal and the Q-phase signal to output a transmission signal. At this time, the transmission signal is generated as a modulation signal (I and Q signals) obtained by amplitude-modulating a carrier signal having a predetermined frequency at a period longer than the period of the carrier signal. A reception signal processed by the baseband signal processing circuit 303 is used, for example, for image display as an image signal or for a telephone call as an audio signal. The radio frequency module 100 communicates a radio frequency signal (a reception signal, a transmission signal) between the first antenna 311 and the second antenna 312 and the RF signal processing circuit 302 of the signal processing circuit 301.

The radio frequency module 100 includes the first power amplifier 1, the second power amplifier 2, a switch 3 (hereinafter also referred to as a first switch 3), a plurality of (for example, two) first filters 4, and a second filter 5. Additionally, the radio frequency module 100 further includes a controller 20. In addition, the radio frequency module 100 further includes a first output matching circuit 13, a second output matching circuit 14, a plurality of (for example, two) first matching circuits 15, and a second matching circuit 16. Moreover, the radio frequency module 100 further includes the low-noise amplifier 9 and an input matching circuit 19. Additionally, the radio frequency module 100 further includes a second switch 6 as a switch other than the first switch 3. In addition, the radio frequency module 100 further includes a first low-pass filter 17 and a second low-pass filter 18. Moreover, the radio frequency module 100 further includes a third switch 7, a fourth switch 23, a fifth switch 24, and a sixth switch 25 as switches other than the first switch 3. Additionally, the radio frequency module 100 further includes matching circuits 26, 27, and 28 (see FIG. 1). Each of the plurality of first filters 4 is a duplexer including a transmission filter 41 and a reception filter 42. Hereinafter, for convenience of explanation, when the two first filters 4 are distinguished from each other, one of the two first filters 4 may be referred to as a first filter 4A and the other may be referred to as a first filter 4B. Moreover, the second filter 5 is a duplexer including a transmission filter 51 and a reception filter 52.

In addition, the radio frequency module 100 also includes a plurality of external connection terminals 8. The plurality of external connection terminals 8 include a first antenna terminal 81, a second antenna terminal 82, two first signal input terminals 83, two second signal input terminals 84, a plurality of (four) control terminals 85, a signal output terminal 86, and a plurality of ground terminals 87 (see FIG. 2). In FIG. 4, only one control terminal 85 of the four control terminals 85 is illustrated. The plurality of ground terminals 87 are terminals that are electrically connected to a ground electrode of the above-described circuit board included in the communication device 300, and are supplied with a ground potential.

Hereinafter, the circuit configuration of the radio frequency module 100 will be described in more detail based on FIG. 4.

The first power amplifier 1 includes a first input terminal 11 and a first output terminal 12. The first power amplifier 1 amplifies a transmission signal in the first frequency band, the transmission signal being input to the first input terminal 11, and outputs the amplified transmission signal from the first output terminal 12. The first frequency band includes, for example, a transmission band of a communication band for frequency division duplex (FDD). More specifically, the first frequency band includes a transmission band of a first communication band for FDD and a transmission band of a second communication band for FDD. The first communication band corresponds to a transmission signal that passes through the transmission filter 41 of the first filter 4A, and is, for example, Band1, Band3, Band2, Band25, Band4, Band66, Band39, or Band34 of the 3GPP LTE standards, or n1, n3, n2, n25, n4, n66, n39, or n34 of 5G NR. The second communication band corresponds to a transmission signal that passes through the transmission filter 41 of the first filter 4B, and is, for example, n50, or n51 of 5G NR.

The first input terminal 11 of the first power amplifier 1 is selectively connected to the two first signal input terminals 83 via the fourth switch 23. The first input terminal 11 of the first power amplifier 1 is connected to the signal processing circuit 301 via one of the two first signal input terminals 83. The two first signal input terminals 83 are terminals for inputting a radio frequency signal (transmission signal) from an external circuit (for example, the signal processing circuit 301) to the radio frequency module 100. One of the two first signal input terminals 83 is a terminal for inputting a transmission signal compliant with the 4G standards to the radio frequency module 100, and the other is a terminal for inputting a transmission signal compliant with the 5G standards to the radio frequency module 100. The first output terminal 12 of the first power amplifier 1 is connected to the common terminal 30 of the first switch 3 with the first output matching circuit 13 interposed therebetween. Thus, the first output terminal 12 of the first power amplifier 1 can be connected to the plurality of first filters 4 via the first switch 3. The first power amplifier 1 is, for example, a multistage amplifier, an in-phase synthesizing amplifier, a differential synthesizing amplifier, or a Doherty amplifier.

The second power amplifier 2 includes a second input terminal 21 and a second output terminal 22. The second power amplifier 2 amplifies a transmission signal in the second frequency band, the transmission signal being input to the second input terminal 21, and outputs the amplified transmission signal from the second output terminal 22. The second frequency band is a frequency band at a higher frequency side than the first frequency band. In the radio frequency module 100 according to Embodiment 1, the first frequency band is a mid-band frequency band, and the second frequency band is a high-band frequency band. The mid-band frequency band is, for example, equal to or more than 1450 MHz and equal to or less than 2200 MHz. The high-band frequency band is, for example, equal to or more than 2300 MHz and equal to or less than 2700 MHz. Additionally, the second frequency band includes, for example, a transmission band of a communication band for time division duplex (TDD). More specifically, the second frequency band includes a transmission band of a third communication band for TDD. The third communication band corresponds to a transmission signal that passes through the transmission filter 51 of the second filter 5, and examples thereof include Band 40 or Band 41 of the 3GPP LTE standards, and n40 or n41 of 5G NR.

The second input terminal 21 of the second power amplifier 2 is selectively connected to the two second signal input terminals 84 via the fifth switch 24. The second input terminal 21 of the second power amplifier 2 is connected to the signal processing circuit 301 via one of the two second signal input terminals 84. The two second signal input terminals 84 are terminals for inputting a radio frequency signal (transmission signal) from an external circuit (for example, the signal processing circuit 301) to the radio frequency module 100. One of the two second signal input terminals 84 is a terminal for inputting a transmission signal compliant with the 4G standards to the radio frequency module 100, and the other is a terminal for inputting a transmission signal compliant with the 5G standards to the radio frequency module 100. The second output terminal 22 of the second power amplifier 2 is connected to a first terminal 250 of the sixth switch 25 with the second output matching circuit 14 interposed therebetween. Thus, the second output terminal 22 of the second power amplifier 2 can be connected to the second filter 5 via the sixth switch 25. The second power amplifier 2 is, for example, a multistage amplifier, an in-phase synthesizing amplifier, a differential synthesizing amplifier, or a Doherty amplifier.

The first switch 3 includes the common terminal 30 and a plurality of (for example, two) selection terminals 31. The common terminal 30 is connected to the first output terminal 12 of the first power amplifier 1 with the first output matching circuit 13 interposed therebetween. Hereinafter, for convenience of explanation, one of the two selection terminals 31 may be referred to as a selection terminal 31A, and the other may be referred to as a selection terminal 31B. In the first switch 3, the selection terminal 31A is connected to an input terminal of the transmission filter 41 of the first filter 4A, and the selection terminal 31B is connected to an input terminal of the transmission filter 41 of the first filter 4B. The first switch 3 is, for example, a switch capable of connecting at least one or more among the plurality of selection terminals 31 to the common terminal 30. Here, the first switch 3 is, for example, a switch capable of one-to-one and one-to-many connections.

The first switch 3 is, for example, a switch integrated circuit (IC). The first switch 3 is controlled by, for example, the controller 20. In this case, the first switch 3 is controlled by the controller 20 to switch connection states between the common terminal 30 and the plurality of selection terminals 31. For example, the first switch 3 may be configured to switch the connection states between the common terminal 30 and the plurality of selection terminals 31 in accordance with a digital control signal input from the controller 20. The first switch 3 may be controlled by the signal processing circuit 301. In this case, the first switch 3 switches the connection states between the common terminal 30 and the plurality of selection terminals 31 in accordance with a control signal from the RF signal processing circuit 302 of the signal processing circuit 301.

The sixth switch 25 includes the first terminal 250 and a second terminal 251. The first terminal 250 is connected to the second output terminal 22 of the second power amplifier 2 with the second output matching circuit 14 interposed therebetween. The second terminal 251 is connected to an input terminal of the transmission filter 51 of the second filter 5.

The sixth switch 25 is, for example, a switch IC. The sixth switch 25 is controlled by, for example, the controller 20. In this case, the sixth switch 25 is controlled by the controller 20 to switch a connection state between the first terminal 250 and the second terminal 251. For example, the sixth switch 25 may be configured to switch the connection state between the first terminal 250 and the second terminal 251 in accordance with a digital control signal input from the controller 20. The sixth switch 25 may be controlled by the signal processing circuit 301. In this case, the sixth switch 25 switches the connection state between the first terminal 250 and the second terminal 251 in accordance with a control signal from the RF signal processing circuit 302 of the signal processing circuit 301.

As described above, each of the plurality of first filters 4 is a duplexer including the transmission filter 41 and the reception filter 42. The transmission filter 41 of the first filter 4A is, for example, a band pass filter whose pass band is a transmission band of the first communication band. The transmission filter 41 of the first filter 4B is, for example, a band pass filter whose pass band is a transmission band of the second communication band. The reception filter 42 of the first filter 4A is, for example, a band pass filter whose pass band is a reception band of the first communication band. The reception filter 42 of the first filter 4B is, for example, a band pass filter whose pass band is a reception band of the second communication band.

As described above, the second filter 5 is a duplexer including the transmission filter 51 and the reception filter 52. The transmission filter 51 of the second filter 5 is, for example, a band pass filter whose pass band is a transmission band of the third communication band. The reception filter 52 of the second filter 5 is, for example, a band pass filter whose pass band is a reception band of the third communication band.

The controller 20 is connected to the first power amplifier 1 and the second power amplifier 2. Additionally, the controller 20 is connected to the signal processing circuit 301 via a plurality of (for example, four) control terminals 85. In FIG. 4, only one of the four control terminals 85 is illustrated. The plurality of control terminals 85 are terminals for inputting control signals from an external circuit (for example, the signal processing circuit 301) to the controller 20. The controller 20 controls the first power amplifier 1 and the second power amplifier 2 based on the control signals acquired from the plurality of control terminals 85. The controller 20 controls the first power amplifier 1 and the second power amplifier 2 in accordance with a control signal from the RF signal processing circuit 302 of the signal processing circuit 301. For example, the controller 20 may be configured to control the first power amplifier 1 and the second power amplifier 2 based on a digital control signal acquired from the signal processing circuit 301.

The first output matching circuit 13 is provided on a signal path between the first output terminal 12 of the first power amplifier 1 and the common terminal 30 of the first switch 3. The first output matching circuit 13 is a circuit for achieving impedance matching between the first power amplifier 1 and the transmission filters 41 of the two first filters 4. The first output matching circuit 13 is configured by, for example, one inductor, but is not limited to being configured by one inductor, and may include, for example, a plurality of inductors and a plurality of capacitors, or may include a transformer.

The second output matching circuit 14 is provided on a signal path between the second output terminal 22 of the second power amplifier 2 and the first terminal 250 of the sixth switch 25. The second output matching circuit 14 is a circuit for achieving impedance matching between the second power amplifier 2 and the transmission filter 51 of the second filter 5. The second output matching circuit 14 is configured by, for example, one inductor, but is not limited to being configured by one inductor, and may include, for example, a plurality of inductors and a plurality of capacitors, or may include a transformer.

The plurality of (for example, two) first matching circuits 15 correspond one-to-one to the plurality of first filters 4. Hereinafter, for convenience of explanation, among the plurality of first matching circuits 15, the first matching circuit 15 corresponding to the first filter 4A may be referred to as a first matching circuit 15A, and the first matching circuit 15 corresponding to the first filter 4B may be referred to as a first matching circuit 15B. The first matching circuit 15A is provided on a signal path between the first filter 4A and the third switch 7. The first matching circuit 15A is a circuit for achieving impedance matching between the first filter 4A and the third switch 7. The first matching circuit 15B is provided on a signal path between the first filter 4B and the third switch 7. The first matching circuit 15B is a circuit for achieving impedance matching between the first filter 4B and the third switch 7. Each of the plurality of first matching circuits 15 is configured by, for example, one inductor, but is not limited to being configured by one inductor, and may include, for example, a plurality of inductors and a plurality of capacitors.

The second matching circuit 16 is provided on a signal path between the second filter 5 and the third switch 7. The second matching circuit 16 is a circuit for impedance matching between the second filter 5 and the third switch 7. The second matching circuit 16 is configured by, for example, one inductor, but is not limited to being configured by one inductor and may include, for example, a plurality of inductors and a plurality of capacitors.

The low-noise amplifier 9 includes an input terminal 91 and an output terminal 92. The low-noise amplifier 9 amplifies a reception signal in the first frequency band and a reception signal in the second frequency band that have been input to the input terminal 91, and outputs the amplified reception signals from the output terminal 92. The input terminal 91 of the low-noise amplifier 9 is connected to a common terminal 60 of the second switch 6 with the input matching circuit 19 interposed therebetween. The output terminal 92 of the low-noise amplifier 9 is connected to the signal output terminal 86. The output terminal 92 of the low-noise amplifier 9 is connected to the signal processing circuit 301 via the signal output terminal 86, for example. The signal output terminal 86 is a terminal for outputting a radio frequency signal (reception signal) from the low-noise amplifier 9 to an external circuit (for example, the signal processing circuit 301).

The input matching circuit 19 is provided on a signal path between the input terminal 91 of the low-noise amplifier 9 and the common terminal 60 of the second switch 6. The input matching circuit 19 is a circuit for achieving impedance matching between the low-noise amplifier 9 and the reception filter 42 of each first filter 4. The input matching circuit 19 is configured by one inductor, for example, but is not limited to being configured by one inductor, and may include a plurality of inductors and a plurality of capacitors, for example.

The second switch 6 includes the common terminal 60 and a plurality of (for example, three) selection terminals 61. The common terminal 60 is connected to the input terminal 91 of the low-noise amplifier 9 with the input matching circuit 19 interposed therebetween. In the second switch 6, one selection terminal 61 of the three selection terminals 61 is connected to the output terminal of the reception filter 42 of the first filter 4A, another selection terminal 61 is connected to the output terminal of the reception filter 42 of the first filter 4B, and the remaining one selection terminal 61 is connected to the output terminal of the reception filter 52 of the second filter 5. The second switch 6 is, for example, a switch capable of connecting at least one or more among the plurality of selection terminals 61 to the common terminal 60. Here, the second switch 6 is, for example, a switch capable of one-to-one and one-to-many connections.

The second switch 6 is, for example, a switch IC. The second switch 6 is controlled by, for example, the signal processing circuit 301. In this case, the second switch 6 switches connection states between the common terminal 60 and the plurality of selection terminals 61 in accordance with a control signal from the RF signal processing circuit 302 of the signal processing circuit 301. For example, the second switch 6 may be configured to switch the connection states between the common terminal 60 and the plurality of selection terminals 61 in accordance with a digital control signal input from the signal processing circuit 301. The second switch 6 may be controlled by the controller 20 instead of being controlled by the signal processing circuit 301.

The third switch 7 includes a first common terminal 70A, a second common terminal 70B, a plurality of (for example, two) first selection terminals 71 connectable to the first common terminal 70A, and a second selection terminal 72 connectable to the second common terminal 70B. The first common terminal 70A is connected to the first antenna terminal 81 through the first low-pass filter 17. The first antenna 311 is connected to the first antenna terminal 81. The plurality of first selection terminals 71 are connected one-to-one to the plurality of first matching circuits 15. Each of the plurality of first selection terminals 71 is connected to a connection point between the output terminal of the transmission filter 41 and the input terminal of the reception filter 42 in the corresponding first filter 4 among the plurality of first filters 4. The second common terminal 70B is connected to the second antenna terminal 82 through the second low-pass filter 18. The second antenna 312 is connected to the second antenna terminal 82. The second selection terminal 72 is connected to a connection point between the output terminal of the transmission filter 51 and the input terminal of the reception filter 52 in the second filter 5 with the second matching circuit 16 interposed therebetween. The third switch 7 is, for example, a switch capable of connecting at least one or more among the plurality of first selection terminals 71 to the first common terminal 70A. Here, the third switch 7 is, for example, a switch capable of one-to-one and one-to-many connections.

The third switch 7 is, for example, a switch IC. The third switch 7 is controlled by, for example, the signal processing circuit 301. In this case, the third switch 7 switches connection states between the first common terminal 70A and the plurality of first selection terminals 71 and a connection state between the second common terminal 70B and the second selection terminal 72 in accordance with a control signal from the RF signal processing circuit 302 of the signal processing circuit 301. For example, the third switch 7 may be configured to switch the connection states between the first common terminal 70A and the plurality of first selection terminals 71 and the connection state between the second common terminal 70B and the second selection terminal 72 in accordance with a digital control signal input from the signal processing circuit 301. The third switch 7 may be controlled by the controller 20 instead of being controlled by the signal processing circuit 301.

The fourth switch 23 includes a common terminal 230 and a plurality of (for example, two) selection terminals 231. The common terminal 230 is connected to the first input terminal 11 of the first power amplifier 1. The two selection terminals 231 are connected one-to-one to the two first signal input terminals 83.

The fourth switch 23 is, for example, a switch IC. The fourth switch 23 is controlled by, for example, the controller 20. In this case, the fourth switch 23 is controlled by the controller 20 to switch connection states between the common terminal 230 and the plurality of selection terminals 231. For example, the fourth switch 23 may be configured to switch the connection states between the common terminal 230 and the plurality of selection terminals 231 in accordance with a digital control signal input from the controller 20. The fourth switch 23 may be controlled by the signal processing circuit 301. In this case, the fourth switch 23 switches the connection states between the common terminal 230 and the plurality of selection terminals 231 in accordance with a control signal from the RF signal processing circuit 302 of the signal processing circuit 301.

The fifth switch 24 includes a common terminal 240 and a plurality of (for example, two) selection terminals 241. The common terminal 240 is connected to the second input terminal 21 of the second power amplifier 2. The two selection terminals 241 are connected one-to-one to the two second signal input terminals 84.

The fifth switch 24 is, for example, a switch IC. The fifth switch 24 is controlled by, for example, the controller 20. In this case, the fifth switch 24 is controlled by the controller 20 to switch connection states between the common terminal 240 and the plurality of selection terminals 241. For example, the fifth switch 24 may be configured to switch the connection states between the common terminal 240 and the plurality of selection terminals 241 in accordance with a digital control signal input from the controller 20. The fifth switch 24 may be controlled by the signal processing circuit 301. In this case, the fifth switch 24 switches the connection states between the common terminal 240 and the plurality of selection terminals 241 in accordance with a control signal from the RF signal processing circuit 302 of the signal processing circuit 301.

The first low-pass filter 17 is connected between the first antenna terminal 81 and the first common terminal 70A of the third switch 7. The first low-pass filter 17 includes, for example, a plurality of inductors and capacitors. The first low-pass filter 17 may be an integrated passive device (IPD) including a plurality of inductors and capacitors.

The second low-pass filter 18 is connected between the second antenna terminal 82 and the second common terminal 70B of the third switch 7. The second low-pass filter 18 includes, for example, a plurality of inductors and capacitors. The second low-pass filter 18 may be an IPD including a plurality of inductors and capacitors.

Figure 4:
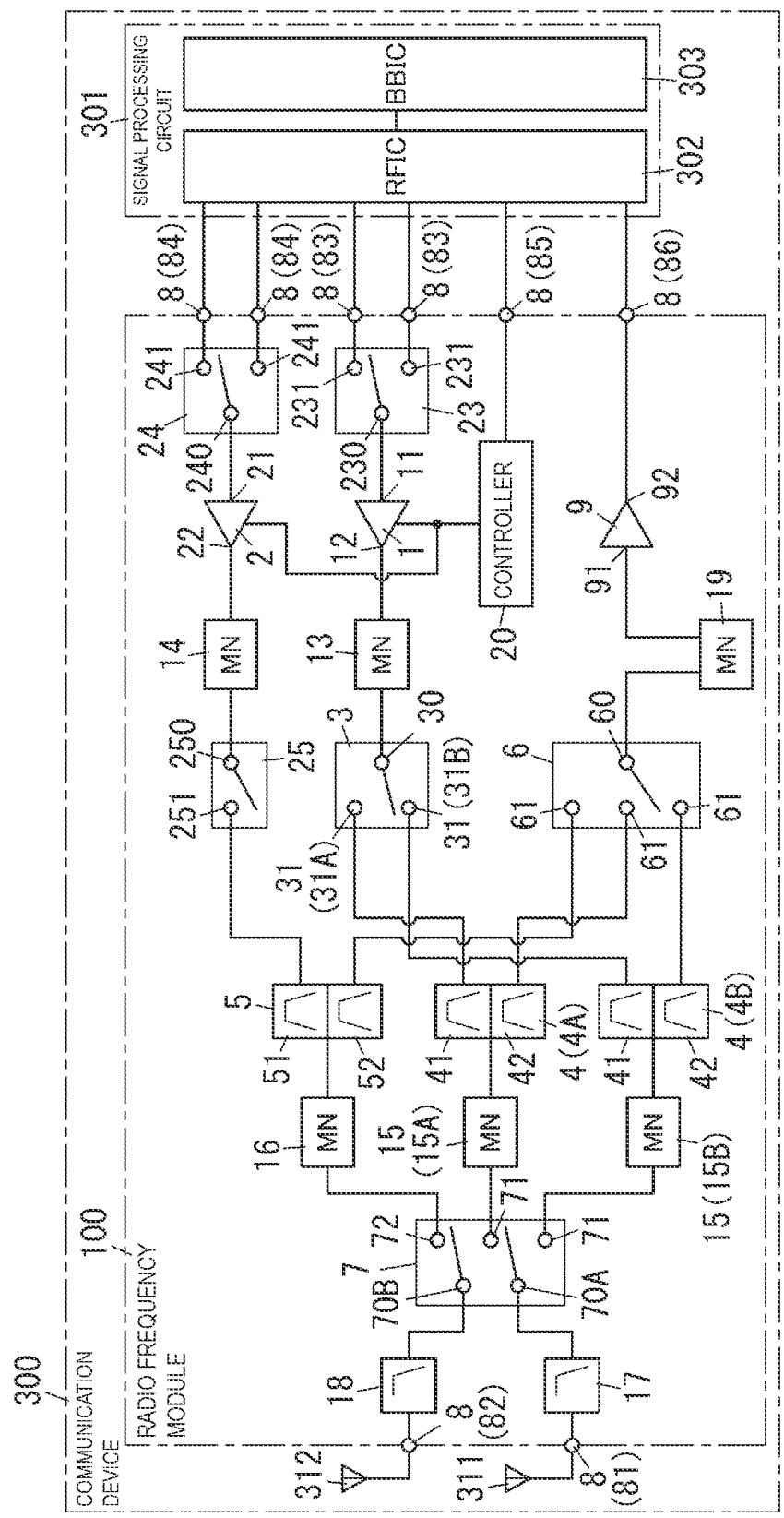
FIG. 4 is a circuit configuration diagram of a communication device including the radio frequency module described above.

Although not illustrated in FIG. 4, the matching circuit 26 is provided on a signal path between the first common terminal 70A of the third switch 7 and the first low-pass filter 17. The matching circuit 26 is a circuit for achieving impedance matching between the first low-pass filter 17 and the third switch 7. The matching circuit 26 is configured by, for example, one inductor, but is not limited to being configured by one inductor, and may include, for example, a plurality of inductors and a plurality of capacitors.

Although not illustrated in FIG. 4, the matching circuit 27 is provided on signal paths between the two selection terminals 31 of the first switch 3 and the input terminals of the transmission filters 41 of the two first filters 4. The matching circuit 27 is a circuit for achieving impedance matching between the first switch 3 and the transmission filters 41 of the two first filters 4. The matching circuit 27 is configured by, for example, one inductor, but is not limited to being configured by one inductor, and may include, for example, a plurality of inductors and a plurality of capacitors.

Although not illustrated in FIG. 4, the matching circuit 28 is provided on a signal path between the selection terminal 251 of the sixth switch 25 and the input terminal of the transmission filter 51 of the second filter 5. The matching circuit 28 is a circuit for achieving impedance matching between the sixth switch 25 and the transmission filter 51 of the second filter 5. The matching circuit 28 is configured by, for example, one inductor, but is not limited to being configured by one inductor, and may include, for example, a plurality of inductors and a plurality of capacitors.

(1.2) Structure of Radio Frequency Module

Next, a structure of the radio frequency module 100 will be described with reference to FIG. 1 to FIG. 3.

The radio frequency module 100 further includes the mounting substrate 10. The mounting substrate 10 includes the first main surface 101 and the second main surface 102 that are opposed to each other in a thickness direction D1 of the mounting substrate 10. The mounting substrate 10 is, for example, a multilayer substrate including a plurality of dielectric layers and a plurality of conductive layers. The plurality of dielectric layers and the plurality of conductive layers are laminated in the thickness direction D1 of the mounting substrate 10. The plurality of conductive layers are formed in a predetermined pattern determined for each layer. Each of the plurality of conductive layers includes one or a plurality of conductive pattern portions 112 (see FIG. 2) in one plane orthogonal to the thickness direction D1 of the mounting substrate 10. A material of each conductive layer is, for example, copper. The plurality of conductive layers include a ground layer. In the radio frequency module 100, the plurality of ground terminals 87 and the ground layer are electrically connected to each other through via conductors 111 (see FIG. 2) and the like included in the mounting substrate 10. The mounting substrate 10 is, for example, a low temperature co-fired ceramics (LTCC) substrate. The mounting substrate 10 is not limited to the LTCC substrate and may be, for example, a printed wiring board, a high temperature co-fired ceramics (HTCC) substrate, or a resin multilayer substrate.

In addition, the mounting substrate 10 is not limited to the LTCC substrate and may be, for example, a wiring structure. The wiring structure is, for example, a multilayer structure. The multilayer structure includes at least one insulating layer and at least one conductive layer. The insulating layer is formed in a predetermined pattern. When a plurality of insulating layers are provided, the plurality of insulating layers are formed in a predetermined pattern determined for each layer. The conductive layer is formed in a predetermined pattern different from the predetermined pattern of the insulating layer. When a plurality of conductive layers are provided, the plurality of conductive layers are formed in a predetermined pattern determined for each layer. The conductive layer may include one or a plurality of rewiring portions. In the wiring structure, the first surface of the two surfaces that are opposed to each other in the thickness direction of the multilayer structure is the first main surface 101 of the mounting substrate 10, and the second surface thereof is the second main surface 102 of the mounting substrate 10. The wiring structure may be, for example, an interposer. The interposer may be an interposer using a silicon substrate, or may be a substrate configured by multiple layers.

The first main surface 101 and the second main surface 102 of the mounting substrate 10 are separated from each other in the thickness direction D1 of the mounting substrate 10, and intersect the thickness direction D1 of the mounting substrate 10. The first main surface 101 of the mounting substrate 10 is, for example, orthogonal to the thickness direction D1 of the mounting substrate 10, but may include, for example, a side surface or the like of the conductive pattern portion 112 as a surface not being orthogonal to the thickness direction D1. Additionally, the second main surface 102 of the mounting substrate 10 is, for example, orthogonal to the thickness direction D1 of the mounting substrate 10, but may include, for example, a side surface or the like of the conductive pattern portion 112 as a surface not being orthogonal to the thickness direction D1. In addition, the first main surface 101 and the second main surface 102 of the mounting substrate 10 may be formed with fine irregularities, recessed portions, or protruding portions. For example, when a recessed portion is formed in the first main surface 101 of the mounting substrate 10, an inner surface of the recessed portion is included in the first main surface 101.

In the radio frequency module 100 according to Embodiment 1, a plurality of circuit components are mounted on the first main surface 101 of the mounting substrate 10. The plurality of circuit components include the first power amplifier 1, the second power amplifier 2, the plurality of first filters 4, the second filter 5, the first output matching circuit 13, the second output matching circuit 14, the plurality of first matching circuits 15, the second matching circuit 16, the first low-pass filter 17, the second low-pass filter 18, and the input matching circuit 19. Further, the plurality of circuit components include the first switch 3, the second switch 6, the third switch 7, the low-noise amplifier 9, the controller 20, the fourth switch 23, the fifth switch 24, and the sixth switch 25. In addition, the plurality of circuit components include the matching circuits 26, 27, and 28. The expression "the circuit component is mounted on the first main surface 101 of the mounting substrate 10" includes a case where the circuit component is disposed (mechanically connected) on the first main surface 101 of the mounting substrate 10 and a case where the circuit component is electrically connected to (an appropriate conductive pattern portion 112 of) the mounting substrate 10.

Figure 1:
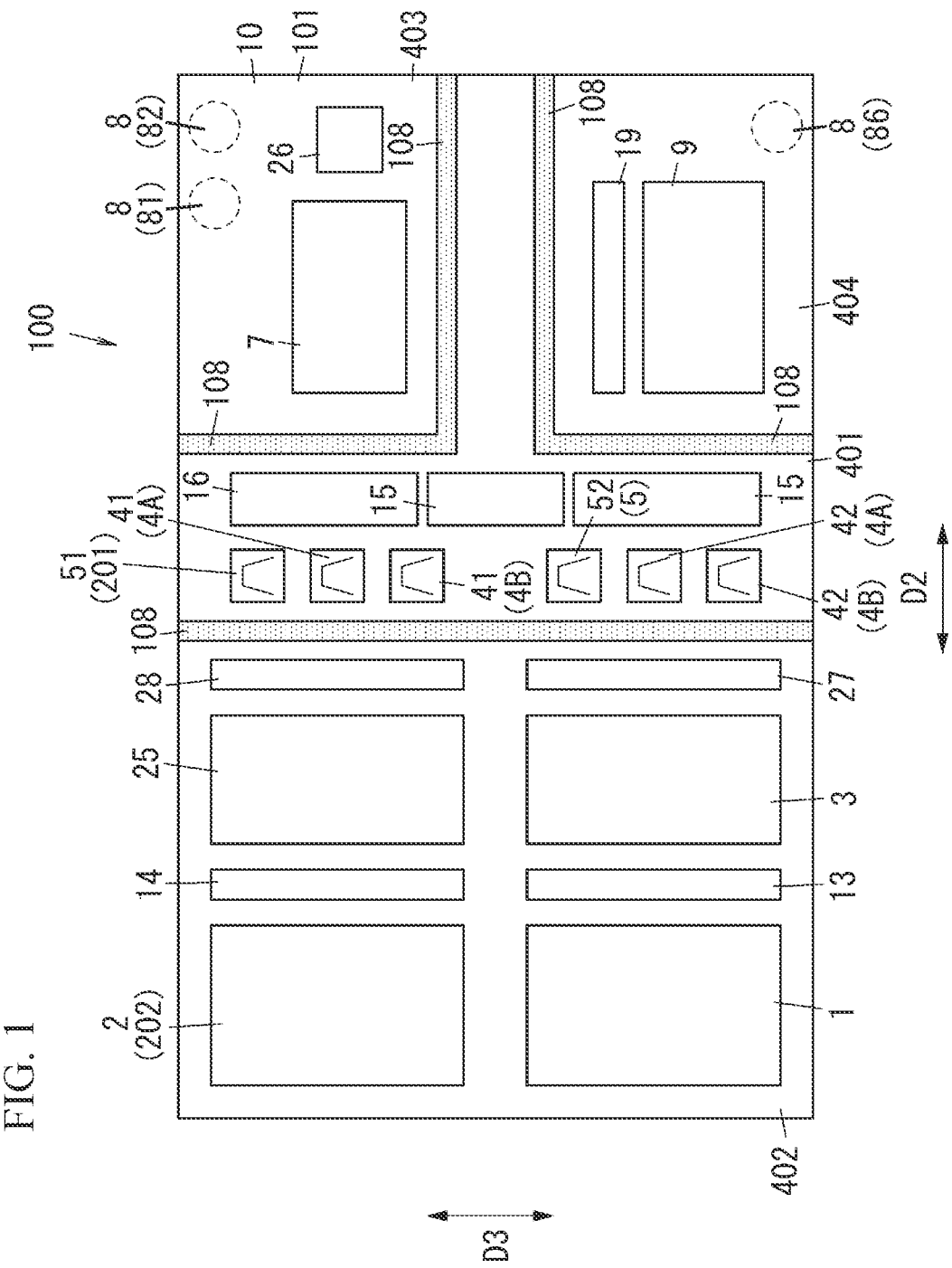
FIG. 1 is a plan view of a radio frequency module according to Embodiment 1.

FIG. 1 illustrates the first power amplifier 1, the second power amplifier 2, the plurality of first filters 4, the second filter 5, the first output matching circuit 13, the second output matching circuit 14, the plurality of first matching circuits 15, and the second matching circuit 16 among the plurality of circuit components mounted on the first main surface 101 of the mounting substrate 10. Additionally, FIG. 1 illustrates the first switch 3, the third switch 7, the sixth switch 25, the low-noise amplifier 9, the input matching circuit 19, and the matching circuits 26, 27, and 28 among the plurality of circuit components mounted on the first main surface 101 of the mounting substrate 10. Note that in FIG. 4, the matching circuits 26, 27, and 28 are not illustrated. FIG. 2 also illustrates the transmission filter 51 of the second filter 5 configured by the first electronic component 201 and the second power amplifier 2 configured by the second electronic component 202 among the plurality of circuit components mounted on the first main surface 101 of the mounting substrate 10.

The first power amplifier 1 is an IC chip including a circuit unit including a first amplifying transistor. As illustrated in FIG. 1, the first power amplifier 1 is flip-chip mounted on the first main surface 101 of the mounting substrate 10. The outer edge of the first power amplifier 1 has a quadrangular shape in plan view from the thickness direction D1 of the mounting substrate 10. The first amplifying transistor is, for example, a heterojunction bipolar transistor (HBT). In this case, the IC chip configuring the first power amplifier 1 is, for example, a GaAs-based IC chip. The first amplifying transistor is not limited to a bipolar transistor such as an HBT, but may be, for example, a field effect transistor (FET). The FET is, for example, a metal-oxide-semiconductor field effect transistor (MOSFET). The IC chip configuring the first power amplifier 1 is not limited to a GaAs-based IC chip, but may be, for example, a Si-based IC chip, a SiGe-based IC chip, or a GaN-based IC chip.

The second power amplifier 2 is an IC chip including a circuit unit including a second amplifying transistor. As illustrated in FIG. 1 and FIG. 2, the second power amplifier 2 is flip-chip mounted on the first main surface 101 of the mounting substrate 10. The outer edge of the second power amplifier 2 has a quadrangular shape in plan view from the thickness direction D1 of the mounting substrate 10. The second amplifying transistor is, for example, an HBT. In this case, the IC chip configuring the second power amplifier 2 is, for example, a GaAs-based IC chip. The second amplifying transistor is not limited to a bipolar transistor such as an HBT, but may be, for example, an FET. The IC chip configuring the second power amplifier 2 is not limited to a GaAs-based IC chip, but may be, for example, a Si-based IC chip, a SiGe-based IC chip, or a GaN-based IC chip.

The low-noise amplifier 9 is, for example, an IC chip including a substrate and a circuit unit (IC unit) formed on the substrate. As illustrated in FIG. 1, the low-noise amplifier 9 is flip-chip mounted on the first main surface 101 of the mounting substrate 10. In plan view from the thickness direction D1 of the mounting substrate 10, the outer edge of the low-noise amplifier 9 has a quadrangular shape. The substrate is, for example, a silicon substrate. The circuit unit has a function of amplifying a reception signal input to the input terminal 91 of the low-noise amplifier 9.

Each of the transmission filter 41 and the reception filter 42 of the two first filters 4 is, for example, a ladder-type filter, and includes a plurality of (for example, four) series arm resonators and a plurality of (for example, three) parallel arm resonators. Each of the two transmission filters 41 and the two reception filters 42 is, for example, an acoustic wave filter. In the acoustic wave filter, each of the plurality of series arm resonators and the plurality of parallel arm resonators is constituted by an acoustic wave resonator. The acoustic wave filter is, for example, a surface acoustic wave filter that uses a surface acoustic wave.

In the surface acoustic wave filter, each of the plurality of series arm resonators and the plurality of parallel arm resonators is, for example, a surface acoustic wave (SAW) resonator.

The surface acoustic wave filter includes, for example, a substrate and a circuit unit formed on the substrate. The substrate is, for example, a piezoelectric substrate. The piezoelectric substrate is, for example, a lithium niobate substrate, a lithium tantalate substrate, or a quartz substrate. The circuit unit includes a plurality of interdigital transducer (IDT) electrodes corresponding one-to-one to the plurality of series arm resonators, and a plurality of IDT electrodes corresponding one-to-one to the plurality of parallel arm resonators.

As illustrated in FIG. 1, each of the transmission filter 41 and the reception filter 42 of the two first filters 4 is mounted on the first main surface 101 of the mounting substrate 10. In plan view from the thickness direction D1 of the mounting substrate 10, the outer edge of each of the transmission filter 41 and the reception filter 42 of the two first filters 4 has a quadrangular shape.

Each of the transmission filter 51 and the reception filter 52 of the second filter 5 is, for example, a ladder-type filter, and includes a plurality of (for example, four) series arm resonators and a plurality of (for example, three) parallel arm resonators. Each of the transmission filter 51 and the reception filter 52 is, for example, an acoustic wave filter. In the acoustic wave filter, each of the plurality of series arm resonators and the plurality of parallel arm resonators is constituted by an acoustic wave resonator. The acoustic wave filter is, for example, a surface acoustic wave filter that uses a surface acoustic wave.

As illustrated in FIG. 1, each of the transmission filter 51 and the reception filter 52 of the second filter 5 is mounted on the first main surface 101 of the mounting substrate 10. In plan view from the thickness direction D1 of the mounting substrate 10, the outer edge of each of the transmission filter 51 and the reception filter 52 of the second filter 5 has a quadrangular shape.

As illustrated in FIG. 1, the circuit components (inductors) of the first output matching circuit 13 are mounted on the first main surface 101 of the mounting substrate 10. In plan view from the thickness direction D1 of the mounting substrate 10, the outer edge of the circuit component included in the first output matching circuit 13 has a quadrangular shape. The circuit component included in the first output matching circuit 13 is, for example, a chip inductor. The first output matching circuit 13 may include an inner layer inductor provided in the mounting substrate 10.

As illustrated in FIG. 1, the circuit components (inductors) of the second output matching circuit 14 are mounted on the first main surface 101 of the mounting substrate 10. In plan view from the thickness direction D1 of the mounting substrate 10, the outer edge of the circuit component included in the second output matching circuit 14 has a quadrangular shape. The circuit component included in the second output matching circuit 14 is, for example, a chip inductor. The second output matching circuit 14 may include an inner layer inductor provided in the mounting substrate 10.

As illustrated in FIG. 1, the circuit components (inductors) of each of the two first matching circuits 15 and the second matching circuit 16 are mounted on the first main surface 101 of the mounting substrate 10. In plan view from the thickness direction D1 of the mounting substrate 10, the outer edge of each circuit component of the two first matching circuits 15 and the second matching circuit 16 has a quadrangular shape. Each circuit component of the two first matching circuits 15 and the second matching circuit 16 is, for example, a chip inductor. Each of the two first matching circuits 15 and the second matching circuit 16 may include an inner layer inductor provided in the mounting substrate 10.

As illustrated in FIG. 1, the circuit components (inductors) included in the input matching circuit 19 are mounted on the first main surface 101 of the mounting substrate 10. In plan view from the thickness direction D1 of the mounting substrate 10, the outer edge of the circuit component included in the input matching circuit 19 has a quadrangular shape. The circuit component of the input matching circuit 19 is, for example, a chip inductor. The input matching circuit 19 may include an inner layer inductor provided in the mounting substrate 10.

As illustrated in FIG. 1, the circuit components (inductors) included in the matching circuit 26 are mounted on the first main surface 101 of the mounting substrate 10. In plan view from the thickness direction D1 of the mounting substrate 10, the outer edge of the circuit component included in the matching circuit 26 has a quadrangular shape. The circuit component of the matching circuit 26 is, for example, a chip inductor. The matching circuit 26 may include an inner layer inductor provided in the mounting substrate 10.

As illustrated in FIG. 1, each circuit component (inductor) of the matching circuits 27 and 28 is mounted on the first main surface 101 of the mounting substrate 10. In plan view from the thickness direction D1 of the mounting substrate 10, the outer edge of each circuit component of the matching circuits 27 and 28 has a quadrangular shape. Each circuit component of the matching circuits 27 and 28 is, for example, a chip inductor. Each of the matching circuits 27 and 28 may include an inner layer inductor provided in the mounting substrate 10.

Although not illustrated, the first low-pass filter 17 and the second low-pass filter 18 are mounted on the first main surface 101 of the mounting substrate 10. A cutoff frequency of the first low-pass filter 17 is higher than the upper limit of the first frequency band. A cutoff frequency of the second low-pass filter 18 is higher than the upper limit of the second frequency band.

Although not illustrated, the second switch 6, the fourth switch 23, and the fifth switch 24 are mounted on the first main surface 101 of the mounting substrate 10. The outer edge of each of the second switch 6, the fourth switch 23, and the fifth switch 24 has a quadrangular shape in plan view from the thickness direction D1 of the mounting substrate 10. Each of the second switch 6, the fourth switch 23, and the fifth switch 24 is, for example, an IC chip including a substrate including a first main surface and a second main surface that are opposed to each other and a circuit unit formed on the first main surface side of the substrate. The substrate is, for example, a silicon substrate. The circuit unit includes a plurality of FETs as a plurality of switching elements. Each of the plurality of switching elements is not limited to the FET and may be, for example, a bipolar transistor. Each of the second switch 6, the fourth switch 23, and the fifth switch 24 is flip-chip mounted on the first main surface 101 of the mounting substrate 10 such that the first main surface, of the first main surface and the second main surface of the substrate, is on the first main surface 101 side of the mounting substrate 10. For example, the second switch 6 may be included in one IC chip together with the low-noise amplifier 9. Additionally, at least one of the fourth switch 23 and the fifth switch 24 may be included in one IC chip together with the controller 20.

As illustrated in FIG. 1, the first switch 3, the third switch 7, and the sixth switch 25 are mounted on the first main surface 101 of the mounting substrate 10. The outer edge of each of the first switch 3, the third switch 7, and the sixth switch 25 has a quadrangular shape in plan view from the thickness direction D1 of the mounting substrate 10. Each of the first switch 3, the third switch 7, and the sixth switch 25 is, for example, an IC chip including a substrate including a first main surface and a second main surface that are opposed to each other and a circuit unit formed on the first main surface side of the substrate. The substrate is, for example, a silicon substrate. The circuit unit includes a plurality of FETs as a plurality of switching elements. Each of the plurality of switching elements is not limited to the FET and may be, for example, a bipolar transistor. Each of the first switch 3, the third switch 7, and the sixth switch 25 is flip-chip mounted on the first main surface 101 of the mounting substrate 10 such that the first main surface, of the first main surface and the second main surface of the substrate, is on the first main surface 101 side of the mounting substrate 10. At least one of the first switch 3 and the sixth switch 25 may be included in one IC chip together with the controller 20. Further, the third switch 7 may be included in one IC chip together with the low-noise amplifier 9.

Although not illustrated, the controller 20 is mounted on the first main surface 101 of the mounting substrate 10. In plan view from the thickness direction D1 of the mounting substrate 10, the outer edge of the controller 20 has a quadrangular shape. The controller 20 is, for example, an IC chip including a substrate including a first main surface and a second main surface that are opposed to each other and a circuit unit formed on the first main surface side of the substrate. The substrate is, for example, a silicon substrate. The circuit unit includes a control circuit that controls the first power amplifier 1 and the second power amplifier 2 in accordance with a control signal from the signal processing circuit 301. The controller 20 may be included in one IC chip together with at least one of the first switch 3, the fourth switch 23, the fifth switch 24, and the sixth switch 25.

As illustrated in FIG. 2, the plurality of external connection terminals 8 are disposed on the second main surface 102 of the mounting substrate 10. The expression "the external connection terminal 8 is disposed on the second main surface 102 of the mounting substrate 10" includes a case where the external connection terminal 8 is mechanically connected to the second main surface 102 of the mounting substrate 10 and a case where the external connection terminal 8 is electrically connected to (an appropriate conductive pattern portion 112 of) the mounting substrate 10. A material of the plurality of external connection terminals 8 is, for example, metal (for example, copper, a copper alloy, or the like). Each of the plurality of external connection terminals 8 is a columnar electrode. The columnar electrode is, for example, a cylindrical electrode. The plurality of external connection terminals 8 are bonded to the conductive pattern portion 112 of the mounting substrate 10 by using, for example, solder, but are not limited to being bonded by using solder, and may be bonded by using, for example, a conductive adhesive (for example, conductive paste), or may be directly bonded.

The plurality of external connection terminals 8 include the first antenna terminal 81, the second antenna terminal 82, the plurality of first signal input terminals 83, the plurality of second signal input terminals 84, the plurality of control terminals 85, the signal output terminal 86, and the plurality of ground terminals 87. The plurality of ground terminals 87 are electrically connected to the ground layer of the mounting substrate 10. The ground layer is a circuit ground of the radio frequency module 100, and the plurality of circuit components of the radio frequency module 100 include circuit components electrically connected to the ground layer.

The radio frequency module 100 further includes the resin layer 105. The resin layer 105 covers each of the plurality of circuit components mounted on the first main surface 101 of the mounting substrate 10. More specifically, the resin layer 105 covers the outer peripheral surface of each of the plurality of circuit components and the main surface of each of the plurality of circuit components on the side opposite to the mounting substrate 10 side. In addition, the resin layer 105 covers the first metal layer 106, which will be described later, disposed on the first main surface 101 of the mounting substrate 10. In addition, the resin layer 105 covers the outer peripheral surface 183 of the metal member 108, which will be described later, disposed between the first electronic component 201 and the second electronic component 202 on the first main surface 101 of the mounting substrate 10. The resin layer 105 contains resin (for example, epoxy resin). The resin layer 105 may contain filler in addition to the resin.

In addition, the radio frequency module 100 further includes the first metal layer 106. The "metal layer" refers to a member whose dimension in the thickness direction is smaller than the dimensions in two directions orthogonal to the thickness direction. In the radio frequency module 100 according to Embodiment 1, the first metal layer 106 extends along the first main surface 101 of the mounting substrate 10, and is in contact with the second metal layer 107 at a first end portion 161, which will be described later. The first metal layer 106 is a ground layer. The first metal layer 106 is disposed on the first main surface 101 of the mounting substrate 10. The expression "the first metal layer 106 is disposed on the first main surface 101 of the mounting substrate 10" includes a case where the first metal layer 106 is mechanically connected to the first main surface 101 of the mounting substrate 10 and a case where the first metal layer 106 is electrically connected to (an appropriate conductive pattern portion 112 of) the mounting substrate 10. In the radio frequency module 100 according to Embodiment 1, the first metal layer 106 is disposed over the entirety of a first region 401 (see FIG. 1), which will be described later, of the first main surface 101 of the mounting substrate 10. A material of the first metal layer 106 is, for example, copper. As illustrated in FIG. 2, the first metal layer 106 includes the first end portion 161, a second end portion 162, and an intermediate portion 163. The first metal layer 106 is in contact with an inner peripheral surface 1721 of a second portion 172 of the second metal layer 107, which will be described later, at the first end portion 161. Additionally, the first metal layer 106 is in contact with a second end portion 182 of the metal member 108, which will be described later, at the second end portion 162. The intermediate portion 163 is disposed between two bumps that are connected to the first electronic component 201, and the two bumps are adjacent to each other in a longitudinal direction D2 of the mounting substrate 10. The expression "the first metal layer 106 is in contact with the second metal layer 107 (or the metal member 108)" means that the first metal layer 106 is directly or indirectly connected to the second metal layer 107 (or the metal member 108), and the first metal layer 106 is electrically connected to the second metal layer 107 (or the metal member 108).

Additionally, the radio frequency module 100 further includes the second metal layer 107. The second metal layer 107 has conductivity. The second metal layer 107 is provided for the purpose of electromagnetic shielding inside and outside the radio frequency module 100. The second metal layer 107 has a multilayer structure in which a plurality of metal layers are laminated, but is not limited to the multilayer structure, and may be a single metal layer. The metal layer contains one or more kinds of metal. The second metal layer 107 includes a first portion 171, a second portion 172, and a third portion 173. The first portion 171 is a portion that covers a main surface 151 of the resin layer 105 on the side opposite to the mounting substrate 10 side. The second portion 172 is a portion that covers an outer peripheral surface 153 of the resin layer 105. The third portion 173 is a portion that covers an outer peripheral surface 103 of the mounting substrate 10. Additionally, the first portion 171 covers an end surface of the first end portion 181 of the metal member 108, which will be described later. The second metal layer 107 is in contact with at least a part of the outer peripheral surface of the ground layer included in the mounting substrate 10. Thus, a potential of the second metal layer 107 can be made the same as a potential of the ground layer.

In addition, the radio frequency module 100 further includes the metal member 108. The term "metal member" includes a member whose dimension in the thickness direction is smaller than the dimensions in the two directions orthogonal to the thickness direction, a member whose dimension in the thickness direction is larger than the dimensions in the two directions orthogonal to the thickness direction, and a member whose dimension in the thickness direction is the same as the dimensions in the two directions orthogonal to the thickness direction. In the radio frequency module 100 according to Embodiment 1, the metal member 108 extends along the thickness direction D1 of the mounting substrate 10, and is a member whose dimension in the thickness direction is larger than the dimensions in the two directions orthogonal to the thickness direction. As illustrated in FIG. 2, the metal member 108 is disposed between the first electronic component 201 and the second electronic component 202 on the first main surface 101 of the mounting substrate 10. The expression "the metal member 108 is disposed between the first electronic component 201 and the second electronic component 202" means that at least one of a plurality of line segments connecting freely selected points in the first electronic component 201 and freely selected points in the second electronic component 202 passes the metal member 108. A material of the metal member 108 is, for example, copper. The metal member 108 includes the first end portion 181 and the second end portion 182 that are both end portions in the thickness direction D1 of the mounting substrate 10. The metal member 108 is in contact with an inner surface 1711 of the first portion 171 of the second metal layer 107 at the first end portion 181. Additionally, the metal member 108 is in contact with the second end portion 162 of the first metal layer 106 at the second end portion 182. That is, the metal member 108 is in contact with the first metal layer 106 and the second metal layer 107. As illustrated in FIG. 1, the metal member 108 is provided over the entirety of a width direction D3 (a vertical direction in FIG. 1) of the mounting substrate 10. As described above, in the radio frequency module 100 according to Embodiment 1, a region (first region 401, which will be described later) in which the first electronic component 201 is disposed and a region (second region 402, which will be described later) in which the second electronic component 202 is disposed are separated from each other by the metal member 108. The expression "the metal member 108 is in contact with the first metal layer 106 (or the second metal layer 107)" means that the metal member 108 is directly or indirectly connected to the first metal layer 106 (or the second metal layer 107), and the metal member 108 is electrically connected to the first metal layer 106 (or the second metal layer 107).

Here, as described above, each of the first electronic component 201 and the second electronic component 202 is mounted on the first main surface 101 of the mounting substrate 10. Additionally, as described above, the first metal layer 106 is disposed on the first main surface 101 of the mounting substrate 10. Then, as illustrated in FIG. 2, each of the first electronic component 201 and the second electronic component 202 is positioned on the side opposite to the mounting substrate 10 side with respect to the first metal layer 106 in the thickness direction D1 of the mounting substrate 10.

Figure 3:
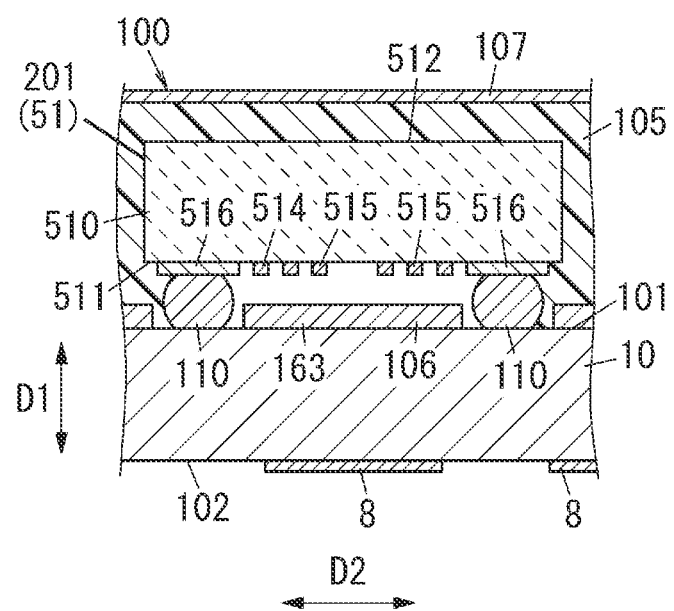
FIG. 3 is an enlarged cross-sectional view of a part of the radio frequency module described above.

In the radio frequency module 100 according to Embodiment 1, as illustrated in FIG. 3, the first electronic component 201 configuring the transmission filter 51 includes a first substrate 510, a first circuit unit 514, and a plurality of first pad electrodes 516. The first substrate 510 is, for example, a piezoelectric substrate. The first substrate 510 includes a third main surface 511 and a fourth main surface 512 that are opposed to each other in the thickness direction of the first substrate 510. The first circuit unit 514 includes a plurality of IDT electrodes 515. The plurality of first pad electrodes 516 are formed on the third main surface 511 side of the first substrate 510, and are connected to the first circuit unit 514. The radio frequency module 100 further includes a plurality of first bumps 110 bonded to the plurality of first pad electrodes 516 and the mounting substrate 10. In the radio frequency module 100 according to Embodiment 1, the first electronic component 201 configuring the transmission filter 51 is mounted on the first main surface 101 of the mounting substrate 10 such that the third main surface 511 of the first substrate 510 is positioned on the first main surface 101 side of the mounting substrate 10.

(1.3) Layout of Radio Frequency Module

Next, the layout of the radio frequency module 100 according to Embodiment 1 will be described with reference to FIG. 1 and FIG. 2.

In the radio frequency module 100 according to Embodiment 1, as illustrated in FIG. 1, the first main surface 101 of the mounting substrate 10 includes the first region 401, the second region 402, a third region 403, and a fourth region 404. The first region 401 is positioned substantially at the center of the first main surface 101 of the mounting substrate 10. The second region 402 is positioned on one side (a left side in FIG. 1) of the first region 401 in the longitudinal direction D2 (a left-right direction in FIG. 1) of the mounting substrate 10. The third region 403 and the fourth region 404 are positioned on the other side (a right side in FIG. 1) of the first region 401 in the longitudinal direction D2 of the mounting substrate 10. Further, the third region 403 and the fourth region 404 are aligned along the width direction D3 (the vertical direction in FIG. 1) of the mounting substrate 10.

The two first filters 4A and 4B, the second filter 5, the two first matching circuits 15, and the second matching circuit 16 are mounted in the first region 401 of the first main surface 101 of the mounting substrate 10. The first power amplifier 1, the second power amplifier 2, the first output matching circuit 13, the second output matching circuit 14, the first switch 3, the sixth switch 25, and the matching circuits 27 and 28 are mounted in the second region 402 of the first main surface 101 of the mounting substrate 10. The third switch 7 and the matching circuit 26 are mounted in the third region 403 of the first main surface 101 of the mounting substrate 10. The low-noise amplifier 9 and the input matching circuit 19 are mounted in the fourth region 404 of the first main surface 101 of the mounting substrate 10. Note that in FIG. 1, as described above, the second switch 6, the fourth switch 23, the fifth switch 24, the controller 20, the first low-pass filter 17, and the second low-pass filter 18 are not illustrated.

In the first region 401, the transmission filter 41 and the reception filter 42 of the two first filters 4 and the transmission filter 51 and the reception filter 52 of the second filter 5 are aligned along the width direction (a short-side direction) D3 of the mounting substrate 10. More specifically, in the width direction D3 of the mounting substrate 10, the two transmission filters 41 and the transmission filter 51 are disposed on one side (the upper side in FIG. 1) and the two reception filters 42 and the reception filter 52 are disposed on the other side (the lower side in FIG. 1) so as to be divided into transmission and reception sides. In addition, in the first region 401, the two first filters 4 and the second filter 5 and the two first matching circuits 15 and the second matching circuit 16 are aligned along the longitudinal direction D2 of the mounting substrate 10.

In the second region 402, the first power amplifier 1 and the second power amplifier 2 are aligned along the width direction D3 (the vertical direction in FIG. 1) of the mounting substrate 10. In addition, in the second region 402, the first switch 3 and the sixth switch 25 are aligned along the width direction D3 of the mounting substrate 10. That is, in the radio frequency module 100 according to Embodiment 1, the first power amplifier 1 and the second power amplifier 2, and the first switch 3 and the sixth switch 25 are aligned along the longitudinal direction D2 (the left-right direction in FIG. 1) of the mounting substrate 10. Additionally, in the second region 402, in the longitudinal direction D2 of the mounting substrate 10, the first output matching circuit 13 is disposed between the first power amplifier 1 and the first switch 3, and the second output matching circuit 14 is disposed between the second power amplifier 2 and the sixth switch 25. In addition, in the second region 402, in the longitudinal direction D2 of the mounting substrate 10, the matching circuit 27 is disposed on the side opposite to the first output matching circuit 13 side with respect to the first switch 3, and the matching circuit 28 is disposed on the side opposite to the second output matching circuit 14 side with respect to the sixth switch 25.

In the third region 403, the third switch 7 and the matching circuit 26 are aligned along the longitudinal direction D2 of the mounting substrate 10. In the fourth region 404, the low-noise amplifier 9 and the input matching circuit 19 are aligned along the width direction D3 of the mounting substrate 10.

In the radio frequency module 100 according to Embodiment 1, as illustrated in FIG. 1, the metal member 108 is provided between the first region 401 and the second region 402. As described above, the metal member 108 separates the first region 401 in which the first electronic component 201 is disposed and the second region 402 in which the second electronic component 202 is disposed. In addition, in the radio frequency module 100 according to Embodiment 1, as illustrated in FIG. 1, the metal member 108 is also provided between the first region 401 and the third region 403. Moreover, in the radio frequency module 100 according to Embodiment 1, as illustrated in FIG. 1, the metal member 108 is also provided between the first region 401 and the fourth region 404. That is, in the radio frequency module 100 according to Embodiment 1, all of the first region 401, the second region 402, the third region 403, and the fourth region 404 are separated by the metal member 108. Note that in FIG. 1, the metal member 108 is hatched with dots so that the metal member 108 can be easily distinguished.

In the radio frequency module 100 according to Embodiment 1, as illustrated in FIG. 2, the first electronic component 201 is disposed in the first region 401. The first electronic component 201 is, for example, the transmission filter 51 of the second filter 5. Additionally, in the radio frequency module 100, as illustrated in FIG. 2, the second electronic component 202 is disposed in the second region 402. The second electronic component 202 is, for example, the second power amplifier 2. In addition, in the radio frequency module 100, as described above, the first metal layer 106 is disposed over the entirety of the first region 401 of the first main surface 101 of the mounting substrate 10. That is, in the radio frequency module 100 according to Embodiment 1, the first metal layer 106 overlaps the first electronic component 201 in plan view from the thickness direction D1 of the mounting substrate 10. More specifically, in plan view from the thickness direction D1 of the mounting substrate 10, a part of the first metal layer 106 and a part of the first electronic component 201 overlap each other. Note that in plan view from the thickness direction D1 of the mounting substrate 10, the entirety of the first metal layer 106 and the entirety of the first electronic component 201 may overlap each other, the entirety of the first metal layer 106 and a part of the first electronic component 201 may overlap each other, or a part of the first metal layer 106 and the entirety of the first electronic component 201 may overlap each other. In short, "the first metal layer 106 and the first electronic component 201 overlap each other in plan view from the thickness direction D1 of the mounting substrate 10" means that at least a part of the first metal layer 106 and at least a part of the first electronic component 201 overlap each other. In the radio frequency module 100 according to Embodiment 1, the first electronic component 201 is disposed in a space SP1 surrounded by the first metal layer 106, the second metal layer 107, and the metal member 108.

In the radio frequency module 100 according to Embodiment 1, as illustrated in FIG. 2, the mounting substrate 10 includes a plurality of conductive pattern portions 112. Each of the plurality of conductive pattern portions 112 is connected to the first electronic component 201 through the via conductor 111. One conductive pattern portion 112 (the left side in FIG. 2) of the plurality of conductive pattern portions 112 is adjacent to the above-described first metal layer 106 in the thickness direction D1 of the mounting substrate 10. The expression "the conductive pattern portion 112 is adjacent to the first metal layer 106" means that there is no other conductor between the conductive pattern portion 112 and the first metal layer 106. When the first metal layer 106 and the conductive pattern portion 112 are adjacent to each other as described above, a parasitic capacitance may be generated between the first metal layer 106 and the conductive pattern portion 112. Thus, in the radio frequency module 100 according to Embodiment 1, the first metal layer 106 is patterned such that the first metal layer 106 and the conductive pattern portion 112 do not overlap each other in the thickness direction D1 of the mounting substrate 10. This makes it possible to reduce the occurrence of a stray capacitance between the first metal layer 106 and the conductive pattern portion 112.

(2) Effects (2.1) Radio Frequency Module

The radio frequency module 100 according to Embodiment 1 includes the mounting substrate 10, the first electronic component 201 and the second electronic component 202, the metal member 108, the first metal layer 106, the resin layer 105, and the second metal layer 107. The mounting substrate 10 includes the first main surface 101 and the second main surface 102 that are opposed to each other. The first electronic component 201 and the second electronic component 202 are mounted on the first main surface 101 of the mounting substrate 10. The metal member 108 is disposed between the first electronic component 201 and the second electronic component 202 on the first main surface 101 of the mounting substrate 10. The first metal layer 106 is disposed on the first main surface 101 of the mounting substrate 10. The resin layer 105 is disposed on the first main surface 101 of the mounting substrate 10. The second metal layer 107 covers at least a part of the resin layer 105. The resin layer 105 covers at least a part of the first electronic component 201, at least a part of the second electronic component 202, the outer peripheral surface 183 of the metal member 108, and the first metal layer 106. The first metal layer 106 has a ground potential and is in contact with the second metal layer 107. The metal member 108 is in contact with the first metal layer 106 and the second metal layer 107.

In the radio frequency module 100 according to Embodiment 1, as described above, the first metal layer 106 disposed on the first main surface 101 of the mounting substrate 10 is in contact with the second metal layer 107. Further, in the radio frequency module 100 according to Embodiment 1, as described above, the metal member 108 disposed between the first electronic component 201 and the second electronic component 202 is in contact with the first metal layer 106 and the second metal layer 107. That is, in the radio frequency module 100 according to Embodiment 1, the metal member 108, the first metal layer 106, and the second metal layer 107 are in contact with each other. Thus, compared to a case where the metal member is in contact with only the second metal layer, the effect of noise suppression by the metal member 108 can be enhanced, and isolation between the first electronic component 201 and the second electronic component 202 can be improved. As a result, characteristic deterioration of each of the first electronic component 201 and the second electronic component 202 can be suppressed.

In addition, for example, when a plurality of inner layer inductors are disposed in the mounting substrate 10, it is possible to improve isolation between the plurality of inner layer inductors by disposing a via conductor directly below the metal member 108.

Additionally, in the radio frequency module 100 according to Embodiment 1, as illustrated in FIG. 2, the intermediate portion 163 of the first metal layer 106 is disposed between the two bumps 210 and 210 connected to the first electronic component 201. Disposing the intermediate portion 163 between the two bumps 210 and 210 in this manner can improve isolation between the two terminals of the first electronic component 201 connected to the two bumps 210 and 210.

(2.2) Communication Device

The communication device 300 according to Embodiment 1 includes the radio frequency module 100 described above and the signal processing circuit 301. The signal processing circuit 301 is connected to the radio frequency module 100.

The communication device 300 according to Embodiment 1 includes the radio frequency module 100, which can improve isolation between the first electronic component 201 and the second electronic component 202.

The plurality of electronic components configuring the signal processing circuit 301 may be mounted on, for example, the above-described circuit board, or may be mounted on a circuit board (second circuit board) different from a circuit board (first circuit board) on which the radio frequency module 100 is mounted.

(3) Modifications (3.1) Modification 1

Figure 5:
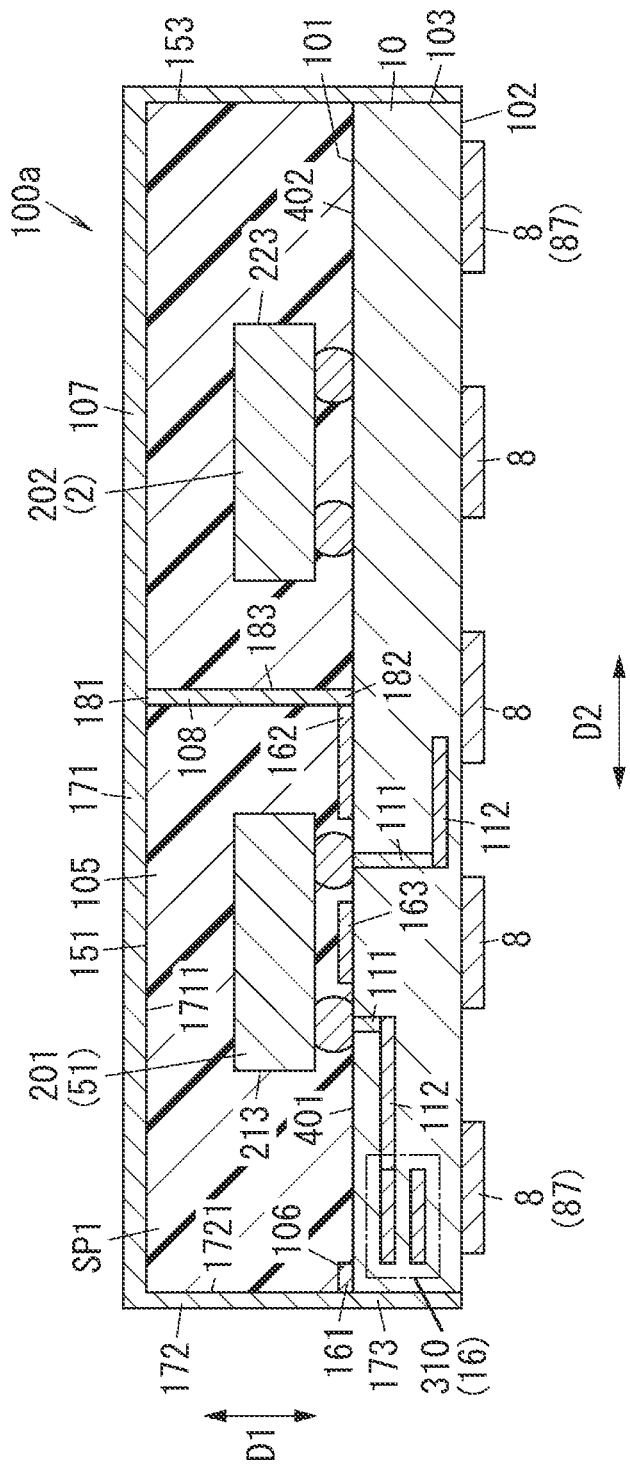
FIG. 5 is a cross-sectional view of a radio frequency module according to Modification 1 of Embodiment 1.

A radio frequency module 100a according to Modification 1 of Embodiment 1 will be described with reference to FIG. 5. Regarding the radio frequency module 100a according to Modification 1, constituent elements the same as or similar to those of the radio frequency module 100 according to Embodiment 1 are denoted by the same signs and description thereof is omitted. Note that a circuit configuration of the radio frequency module 100a is the same as or similar to that of the radio frequency module 100 according to Embodiment 1 described with reference to FIG. 4.

The radio frequency module 100a according to Modification 1 is different from the radio frequency module 100 according to Embodiment 1 in that an inductor 310 configuring the second matching circuit 16 is incorporated in the mounting substrate 10.

In the radio frequency module 100a according to Modification 1, the inductor 310 configuring the second matching circuit 16 is incorporated in the mounting substrate 10. As described above, the second matching circuit 16 is connected to the connection point between the output terminal of the transmission filter 51 and the input terminal of the reception filter 52 of the second filter 5 (see FIG. 4). In the example in FIG. 5, the inductor 310 is connected to the first electronic component 201 through the via conductor 111 and the conductive pattern portion 112. As described above, the first electronic component 201 is the transmission filter 51 of the second filter 5 (see FIG. 4). The inductor 310 is, for example, an inner layer inductor, but may be a chip inductor.

When the inductor 310 is incorporated in the mounting substrate 10 as in the radio frequency module 100a according to Modification 1, depending on a distance between the inductor 310 and the first metal layer 106 disposed on the first main surface 101 of the mounting substrate 10, a parasitic capacitance may be generated between the inductor 310 and the first metal layer 106. Thus, in the radio frequency module 100a according to Modification 1, the first metal layer 106 is patterned such that the first metal layer 106 and the inductor 310 do not overlap each other in the thickness direction D1 of the mounting substrate 10. This makes it possible to reduce the occurrence of a stray capacitance between the first metal layer 106 and the inductor 310. In addition, in the radio frequency module 100a according to Modification 1, as illustrated in FIG. 5, the first metal layer 106 is positioned between the first electronic component 201 and the inductor 310 in the thickness direction D1 of the mounting substrate 10. This makes it possible to improve the isolation between the first electronic component 201 and the inductor 310.

(3.2) Modification 2

Figure 6:
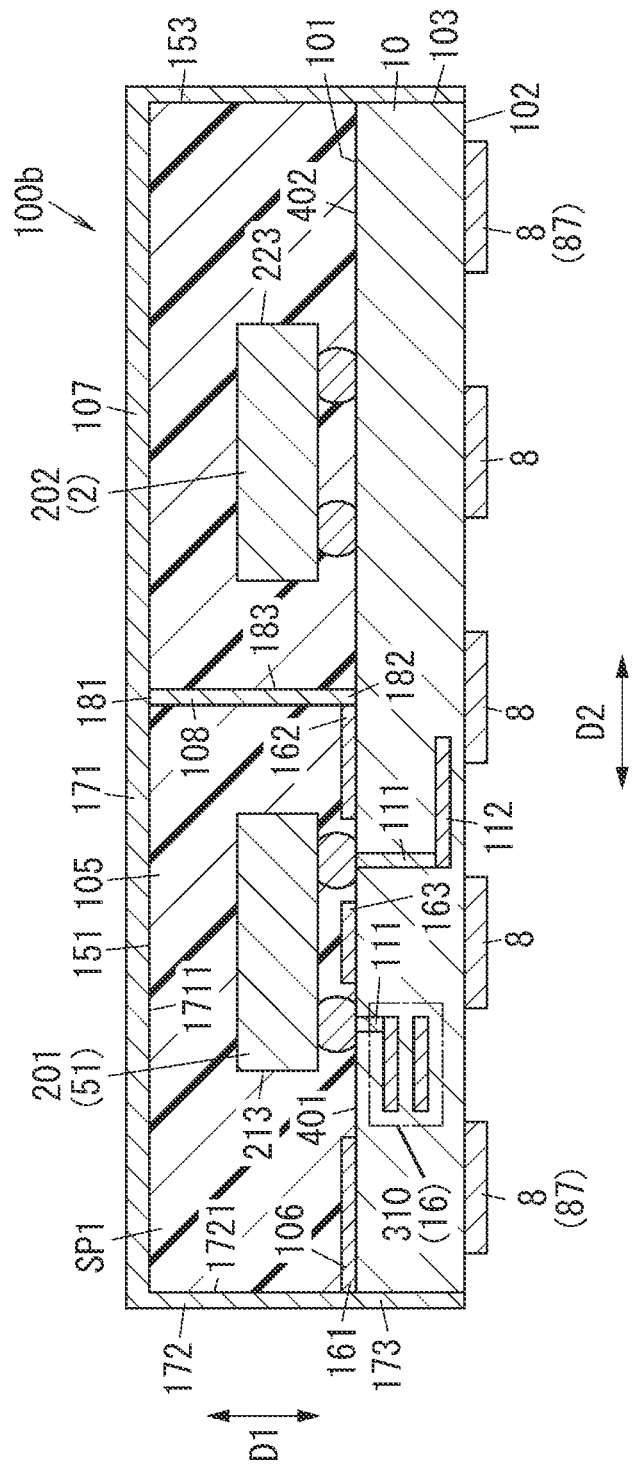
FIG. 6 is a cross-sectional view of a radio frequency module according to Modification 2 of Embodiment 1.

A radio frequency module 100b according to Modification 2 of Embodiment 1 will be described with reference to FIG. 6. Regarding the radio frequency module 100b according to Modification 2, constituent elements the same as or similar to those of the radio frequency module 100a according to Modification 1 are denoted by the same signs, and description thereof is omitted. Note that a circuit configuration of the radio frequency module 100b is the same as or similar to that of the radio frequency module 100 according to Embodiment 1 described with reference to FIG. 4.

The radio frequency module 100b according to Modification 2 is different from the radio frequency module 100a according to Modification 1 in that the inductor 310 configuring the second matching circuit 16 overlaps the first electronic component 201 in plan view from the thickness direction D1 of the mounting substrate 10.

In the radio frequency module 100b according to Modification 2, the inductor 310 configuring the second matching circuit 16 overlaps the first electronic component 201 in plan view from the thickness direction D1 of the mounting substrate 10. More specifically, in plan view from the thickness direction D1 of the mounting substrate 10, a part of the first electronic component 201 and a part of the inductor 310 overlap each other. Note that in plan view from the thickness direction D1 of the mounting substrate 10, a part of the first electronic component 201 and the entirety of the inductor 310 may overlap each other, the entirety of the first electronic component 201 and a part of the inductor 310 may overlap each other, or the entirety of the first electronic component 201 and the entirety of the inductor 310 may overlap each other. In short, the expression "the first electronic component 201 and the inductor 310 overlap each other in plan view from the thickness direction D1 of the mounting substrate 10" means that at least a part of the first electronic component 201 and at least a part of the inductor 310 overlap each other in plan view from the thickness direction D1 of the mounting substrate 10.

Also in the radio frequency module 100b according to Modification 2, the first metal layer 106 can be patterned such that the first metal layer 106 and the inductor 310 do not overlap each other in the thickness direction D1 of the mounting substrate 10 such that a parasitic capacitance does not occur between the first metal layer 106 and the inductor 310.

In the radio frequency module 100b according to Modification 2, as described above, the first electronic component 201 and the inductor 310 overlap each other in the thickness direction D1 of the mounting substrate 10. This makes it possible to shorten a wiring length between the first electronic component 201 and the inductor 310, and as a result, it is possible to suppress characteristic deterioration due to the wiring length.

(3.3) Modification 3

A radio frequency module 100c according to Modification 3 of Embodiment 1 will be described with reference to FIG. 7. Regarding the radio frequency module 100c according to Modification 3, constituent elements the same as or similar to those of the radio frequency module 100 according to Embodiment 1 are denoted by the same signs, and description thereof is omitted. Note that a circuit configuration of the radio frequency module 100c is the same as or similar to that of the radio frequency module 100 according to Embodiment 1 described with reference to FIG. 4.

The radio frequency module 100c according to Modification 3 is different from the radio frequency module 100a according to Modification 1 in that the inductor 310 configuring the second matching circuit 16 is mounted on the first main surface 101 of the mounting substrate 10.

In the radio frequency module 100c according to Modification 3, the inductor 310 constituting the second matching circuit 16 is mounted on the first main surface 101 of the mounting substrate 10. More specifically, the inductor 310 is mounted in the first region 401 of the first main surface 101 of the mounting substrate 10. Thus, in the radio frequency module 100c according to Modification 3, as illustrated in FIG. 7, the first metal layer 106 is not provided at a portion of the first main surface 101 of the mounting substrate 10 on which the inductor 310 is mounted. The inductor 310 is, for example, a chip inductor. The inductor 310 is connected to the first electronic component 201 through the conductive pattern portion 112.

Figure 7:
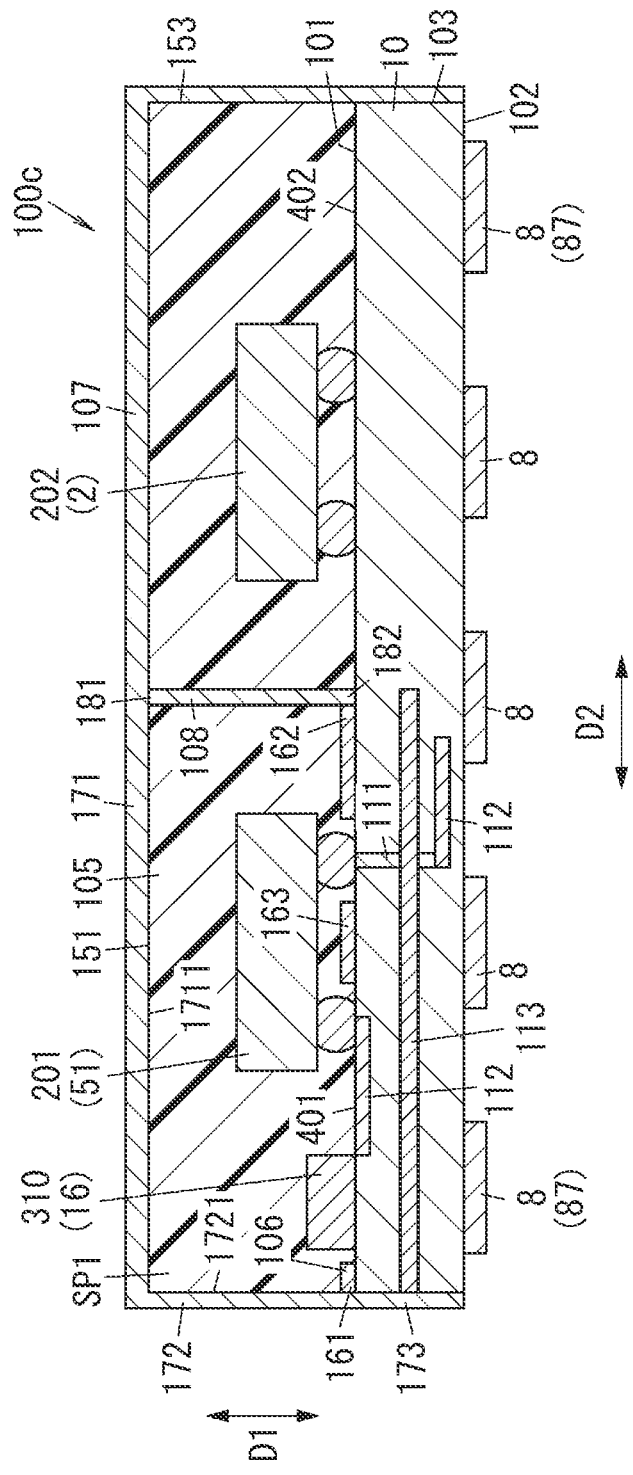
FIG. 7 is a cross-sectional view of a radio frequency module according to Modification 3 of Embodiment 1.

Additionally, in the radio frequency module 100c according to Modification 3, the mounting substrate 10 includes a ground layer 113 as illustrated in FIG. 7. The ground layer 113 can be provided in an intermediate portion of the mounting substrate 10 in the thickness direction D1 of the mounting substrate 10 or on a side closer to the second main surface 102 than the intermediate portion so that a parasitic capacitance is less likely to be generated between the ground layer 113 and the inductor 310 and between the ground layer 113 and the conductive pattern portion 112 connecting the inductor 310 and the first electronic component 201.

Embodiment 2

A radio frequency module 100d according to Embodiment 2 will be described with reference to FIG. 8. With regard to the radio frequency module 100d according to Embodiment 2, constituent elements the same as or similar to those of the radio frequency module 100 according to Embodiment 1 are denoted by the same signs and description thereof is omitted. Note that a circuit configuration of the radio frequency module 100d is the same as or similar to that of the radio frequency module 100 according to Embodiment 1 described with reference to FIG. 4.

The radio frequency module 100d according to Embodiment 2 is different from the radio frequency module 100 according to Embodiment 1 in that the third electronic component 203 and the fourth electronic component 204 are mounted on the second main surface 102 of the mounting substrate 10. That is, the radio frequency module 100d according to Embodiment 2 is a radio frequency module having a double-sided mounting structure.

Figure 8:
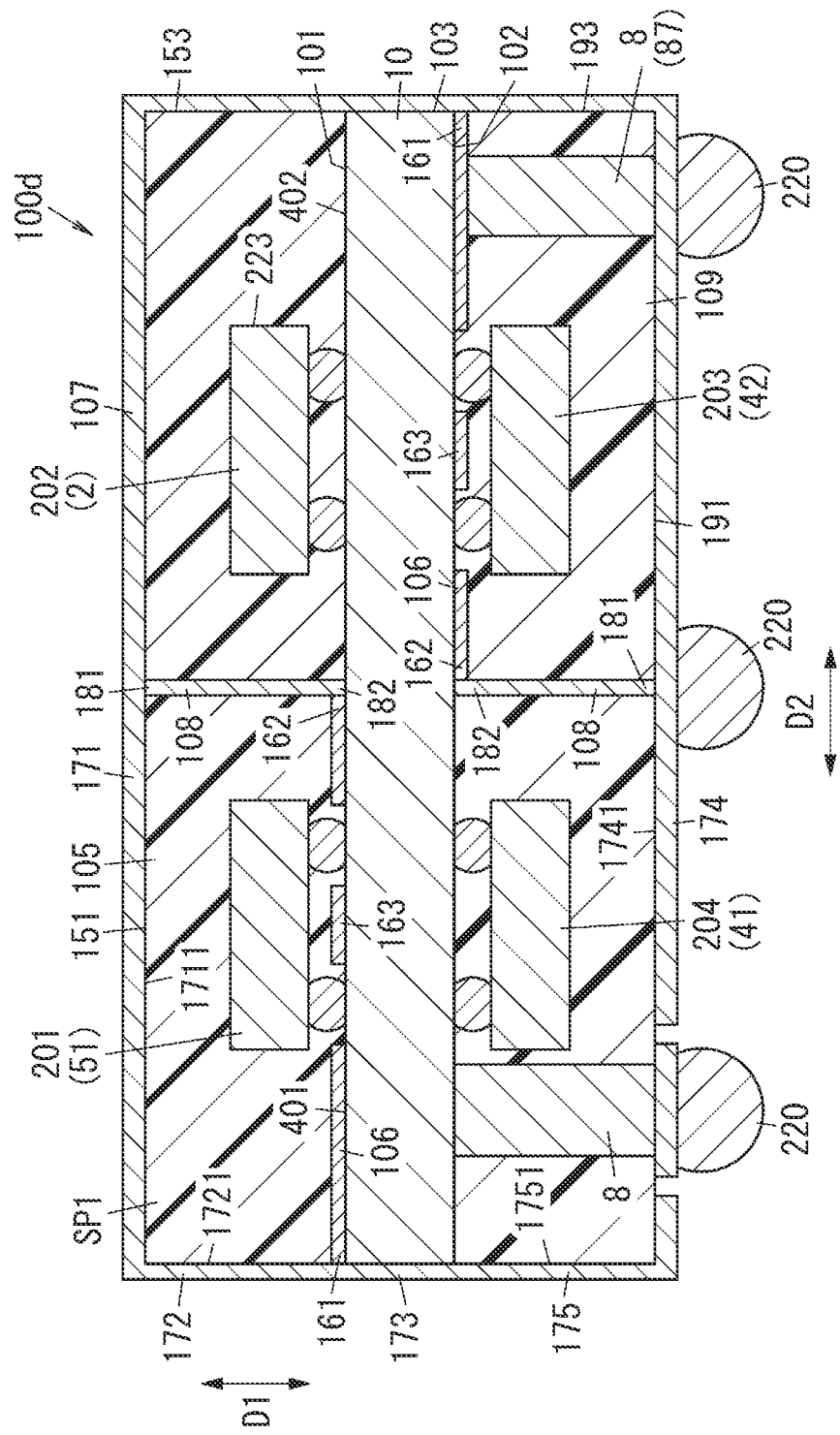
FIG. 8 is a cross-sectional view of a radio frequency module according to Embodiment 2.

In the radio frequency module 100d according to Embodiment 2, as illustrated in FIG. 8, the first electronic component 201 and the second electronic component 202 are mounted on the first main surface 101 of the mounting substrate 10. The first electronic component 201 is, for example, the transmission filter 51 of the second filter 5 (see FIG. 4). The second electronic component 202 is, for example, the second power amplifier 2. In addition, in the radio frequency module 100d according to Embodiment 2, as illustrated in FIG. 8, the third electronic component 203 and the fourth electronic component 204 are mounted on the second main surface 102 of the mounting substrate 10. The third electronic component 203 is, for example, the reception filter 42 of the first filter 4A (see FIG. 4). The fourth electronic component 204 is, for example, the transmission filter 41 of the first filter 4A.

The radio frequency module 100d according to Embodiment 2 includes a second resin layer 109 in addition to the resin layer 105 (hereinafter also referred to as a "first resin layer 105"), the first metal layer 106, the second metal layer 107, and the metal member 108.

The second resin layer 109 covers the third electronic component 203 and the fourth electronic component 204 that are mounted on the second main surface 102 of the mounting substrate 10 and the outer peripheral surface of each of the plurality of external connection terminals 8. The second resin layer 109 contains resin (for example, epoxy resin). The second resin layer 109 may contain filler in addition to the resin. A material of the second resin layer 109 may be a material the same as or different from the material of the first resin layer 105.

The second metal layer 107 includes the first portion 171, the second portion 172, the third portion 173, a fourth portion 174, and a fifth portion 175. The first portion 171 is a portion that covers the main surface 151 of the first resin layer 105 on the side opposite to the mounting substrate 10 side. The second portion 172 is a portion that covers the outer peripheral surface 153 of the first resin layer 105. The third portion 173 is a portion that covers the outer peripheral surface 103 of the mounting substrate 10. The fourth portion 174 is a portion that covers a main surface 191 of the second resin layer 109 on the side opposite to the mounting substrate 10 side. The fifth portion 175 is a portion that covers an outer peripheral surface 193 of the second resin layer 109. Additionally, each of the first portion 171 and the fourth portion 174 covers the end surface of the first end portion 181 of the corresponding metal member 108 among the plurality of metal members 108.

The first metal layer 106 is disposed over the entirety of the first region 401 of the first main surface 101 of the mounting substrate 10 over which the first electronic component 201 is mounted. The first metal layer 106 is in contact with the inner peripheral surface 1721 of the second portion 172 of the second metal layer 107 at the first end portion 161. Additionally, the metal member 108 is disposed between the first electronic component 201 and the second electronic component 202 on the first main surface 101 of the mounting substrate 10. The metal member 108 is in contact with the inner surface 1711 of the first portion 171 of the second metal layer 107 at the first end portion 181, and is in contact with the second end portion 162 of the first metal layer 106 at the second end portion 182.

Additionally, in the radio frequency module 100d according to Embodiment 2, the first metal layer 106 is disposed over the entirety of a region of the second main surface 102 of the mounting substrate 10 over which the third electronic component 203 is mounted. The first metal layer 106 is in contact with an inner peripheral surface 1751 of the fifth portion 175 of the second metal layer 107. Furthermore, in the radio frequency module 100d according to Embodiment 2, the metal member 108 is disposed between the third electronic component 203 and the fourth electronic component 204 on the second main surface 102 of the mounting substrate 10. The metal member 108 is in contact with the second metal layer 107 at the first end portion 181, and is in contact with the second end portion 162 of the first metal layer 106 at the second end portion 182. In addition, in the radio frequency module 100d according to Embodiment 2, the first metal layer 106 is also connected to the ground terminal 87.

As illustrated in FIG. 8, the radio frequency module 100d according to Embodiment 2 is mounted on the above-described circuit board by a plurality of bumps 220 provided on the second main surface 102 side of the mounting substrate 10.

In the radio frequency module 100d according to Embodiment 2, the metal member 108 is disposed between the first electronic component 201 and the second electronic component 202 and between the third electronic component 203 and the fourth electronic component 204. Then, each metal member 108 is in contact with the second metal layer 107 at the first end portion 181 and is in contact with the first metal layer 106 at the second end portion 182. This can improve isolation between the first electronic component 201 and the second electronic component 202 and between the third electronic component 203 and the fourth electronic component 204 as compared to a case where each metal member is in contact with only the second metal layer.

Embodiment 3

A radio frequency module 100e according to Embodiment 3 will be described with reference to FIG. 9. With regard to the radio frequency module 100e according to Embodiment 3, constituent elements the same as or similar to those of the radio frequency module 100 according to Embodiment 1 are denoted by the same signs and description thereof is omitted. Note that a circuit configuration of the radio frequency module 100e is the same as or similar to that of the radio frequency module 100 according to Embodiment 1 described with reference to FIG. 4.

The radio frequency module 100e according to Embodiment 3 is different from the radio frequency module 100 according to Embodiment 1 in that two first electronic components 201 are mounted in the first region 401.

Figure 9:
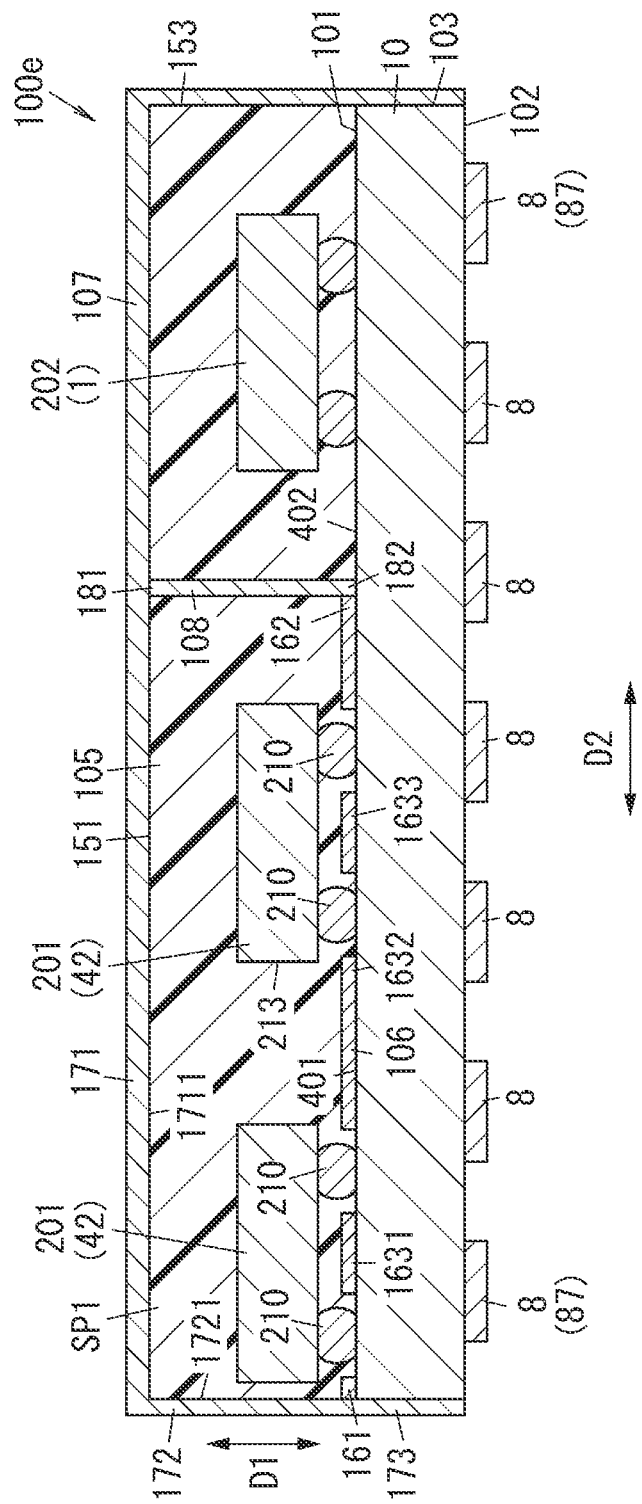
FIG. 9 is a cross-sectional view of a radio frequency module according to Embodiment 3.

In the radio frequency module 100e according to Embodiment 3, as illustrated in FIG. 9, the two first electronic components 201 are mounted in the first region 401 of the first main surface 101 of the mounting substrate 10. Each of the two first electronic components 201 is, for example, the reception filter 42 of each of the two first filters 4 (see FIG. 4). Additionally, in the radio frequency module 100e according to Embodiment 3, as illustrated in FIG. 9, one second electronic component 202 is mounted in the second region 402 of the first main surface 101 of the mounting substrate 10. The second electronic component 202 is, for example, the first power amplifier 1.

In addition, in the radio frequency module 100e according to Embodiment 3, the first metal layer 106 is disposed over the entirety of the first region 401 of the first main surface 101 of the mounting substrate 10 in which the two first electronic components 201 are mounted. The first metal layer 106 includes the first end portion 161, the second end portion 162, a first intermediate portion 1631, a second intermediate portion 1632, and a third intermediate portion 1633. The first metal layer 106 is in contact with the inner peripheral surface 1721 of the second portion 172 of the second metal layer 107 at the first end portion 161. Additionally, the first metal layer 106 is in contact with the second end portion 182 of the metal member 108 at the second end portion 162.

The first intermediate portion 1631 is positioned between the two bumps 210 and 210 connected to one (on the left side in FIG. 9) of the first electronic components 201. Additionally, the third intermediate portion 1633 is positioned between the two bumps 210 and 210 connected to the other first electronic component 201 (on the right side in FIG. 9). Isolation between two terminals of the first electronic component 201 to which the two bumps 210 and 210 are individually connected can be improved by the first intermediate portion 1631 or the third intermediate portion 1633. Additionally, the second intermediate portion 1632 is positioned between the two first electronic components 201 aligned along the longitudinal direction D2 of the mounting substrate 10. This can improve the isolation between the two first electronic components 201 as compared with a case where there is no second intermediate portion between the two first electronic components.

Further, in the radio frequency module 100e according to Embodiment 3, the metal member 108 is disposed between the two first electronic components 201 and the second electronic component 202 on the first main surface 101 of the mounting substrate 10. The metal member 108 is in contact with the inner surface 1711 of the first portion 171 of the second metal layer 107 at the first end portion 181, and is in contact with the second end portion 162 of the first metal layer 106 at the second end portion 182. That is, in the radio frequency module 100e according to Embodiment 3, the two first electronic components 201 are disposed in the space SP1 surrounded by the first metal layer 106, the second metal layer 107, and the metal member 108.

In the radio frequency module 100e according to Embodiment 3, as described above, the first electronic component 201 and the second electronic component 202 are separated from each other by the metal member 108. The metal member 108 is in contact with the inner surface 1711 of the first portion 171 of the second metal layer 107 at the first end portion 181, and is in contact with the first metal layer 106 at the second end portion 182. In addition, the first metal layer 106 is in contact with the inner peripheral surface 1721 of the second portion 172 of the second metal layer 107 at the first end portion 161. This can improve the isolation between the first electronic component 201 and the second electronic component 202 as compared with a case where the metal member is in contact with only the second metal layer.

Embodiment 4

Figure 10:
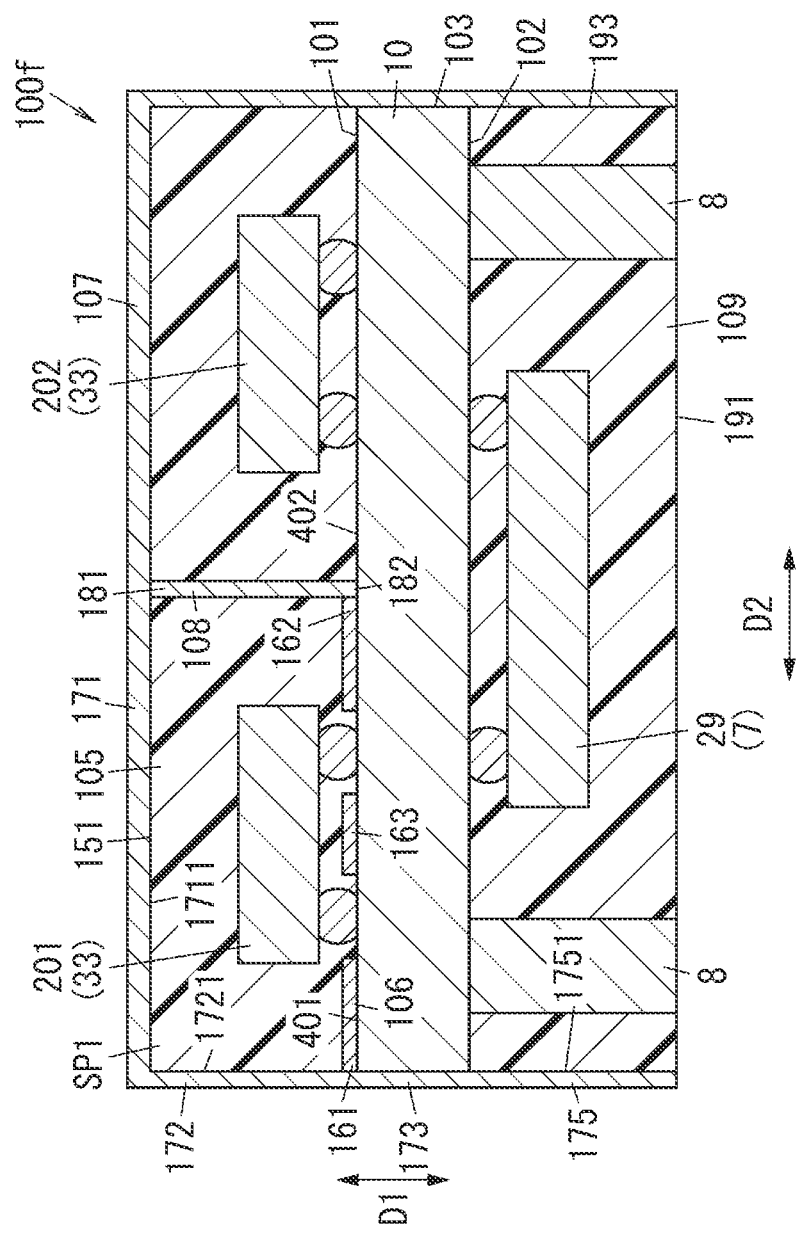
FIG. 10 is a cross-sectional view of a radio frequency module according to Embodiment 4.

A radio frequency module 100f according to Embodiment 4 will be described with reference to FIG. 10. With regard to the radio frequency module 100f according to Embodiment 4, constituent elements the same as or similar to those of the radio frequency module 100 according to Embodiment 1 are denoted by the same signs and description thereof is omitted.

The radio frequency module 100f according to Embodiment 4 is different from the radio frequency module 100 according to Embodiment 1 in that an IC chip 29 including the third switch 7 is mounted on the second main surface 102 of the mounting substrate 10. Additionally, the radio frequency module 100f according to Embodiment 4 is different from the radio frequency module 100 according to Embodiment 1 in that each of the first electronic component 201 and the second electronic component 202 is a filter constituting a multiplexer 33.

(1) Configuration of Radio Frequency Module

Hereinafter, a configuration of the radio frequency module 100f according to Embodiment 4 will be described with reference to FIG. 10.

In the radio frequency module 100f according to Embodiment 4, the first electronic component 201 is mounted in the first region 401 of the first main surface 101 of the mounting substrate 10. Additionally, in the radio frequency module 100f according to Embodiment 4, the second electronic component 202 is mounted in the second region 402 of the first main surface 101 of the mounting substrate 10. Each of the first electronic component 201 and the second electronic component 202 is a filter constituting the multiplexer 33. The metal member 108 is disposed between the first electronic component 201 and the second electronic component 202 over the first main surface 101 of the mounting substrate 10. Further, the first metal layer 106 is disposed over the entirety of the first region 401 of the first main surface 101 of the mounting substrate 10 in which the first electronic component 201 is mounted. The first metal layer 106 is in contact with the inner peripheral surface 1721 of the second portion 172 of the second metal layer 107 at the first end portion 161, and is in contact with the second end portion 182 of the metal member 108 at the second end portion 162. Additionally, the metal member 108 is in contact with the inner surface 1711 of the first portion 171 of the second metal layer 107 at the first end portion 181. In the radio frequency module 100f according to Embodiment 4, the first electronic component 201 is disposed in the space SP1 surrounded by the first metal layer 106, the second metal layer 107, and the metal member 108.

In addition, in the radio frequency module 100f according to Embodiment 4, the IC chip 29 including the third switch 7 is mounted on the second main surface 102 of the mounting substrate 10. Each of the first electronic component 201 and the second electronic component 202 overlaps the IC chip 29 in plan view from the thickness direction D1 of the mounting substrate 10. More specifically, in plan view from the thickness direction D1 of the mounting substrate 10, a part of each of the first electronic component 201 and the second electronic component 202 overlaps a part of the IC chip 29. Note that in plan view from the thickness direction D1 of the mounting substrate 10, a part of the first electronic component 201 and the entirety of the second electronic component 202 may overlap a part of the IC chip 29, the entirety of the first electronic component 201 and a part of the second electronic component 202 may overlap a part of the IC chip 29, or the entirety of each of the first electronic component 201 and the second electronic component 202 may overlap a part of the IC chip 29. In short, the expression "each of the first electronic component 201 and the second electronic component 202 overlaps the IC chip 29 in plan view from the thickness direction D1 of the mounting substrate 10" means that at least a part of each of the first electronic component 201 and the second electronic component 202 overlaps a part of the IC chip 29 in plan view from the thickness direction D1 of the mounting substrate 10.

In the radio frequency module 100f according to Embodiment 4, as described above, the first electronic component 201 and the second electronic component 202 are separated from each other by the metal member 108. The metal member 108 is in contact with the inner surface 1711 of the first portion 171 of the second metal layer 107 at the first end portion 181, and is in contact with the first metal layer 106 at the second end portion 182. In addition, the first metal layer 106 is in contact with the inner peripheral surface 1721 of the second portion 172 of the second metal layer 107 at the first end portion 161. This can improve the isolation between the first electronic component 201 and the second electronic component 202 as compared with a case where the metal member is in contact with only the second metal layer.

Moreover, in the radio frequency module 100f according to Embodiment 4, as described above, each of the first electronic component 201 and the second electronic component 202 overlaps the IC chip 29 including the third switch 7 in plan view from the thickness direction D1 of the mounting substrate 10. This makes it possible to shorten a wiring length between the first electronic component 201 and the IC chip 29 and a wiring length between the second electronic component 202 and the IC chip 29.

(2) Modification 1

Figure 11:
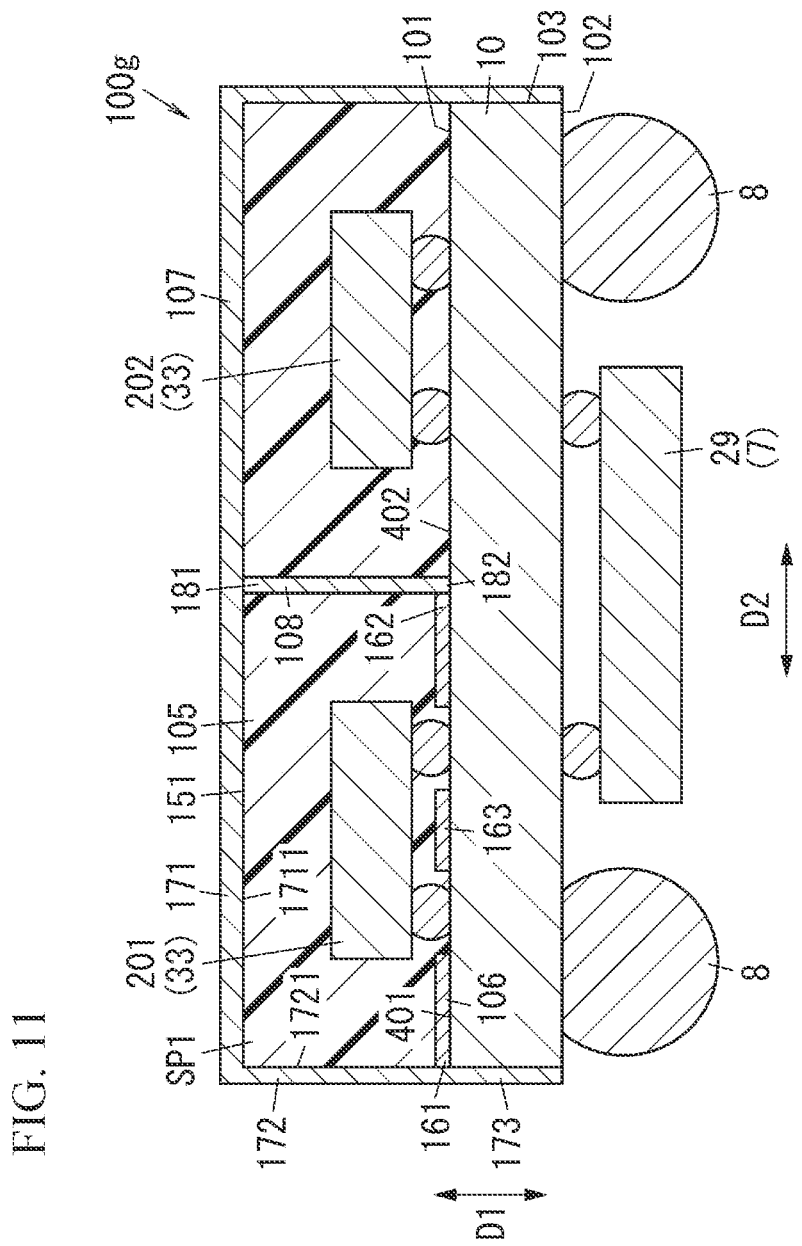
FIG. 11 is a cross-sectional view of a radio frequency module according to Modification 1 of Embodiment 4.

Next, a radio frequency module 100g according to Modification 1 of Embodiment 4 will be described with reference to FIG. 11. Regarding the radio frequency module 100g according to Modification 1, constituent elements the same as or similar to those of the radio frequency module 100f according to Embodiment 4 are denoted by the same signs, and description thereof is omitted.

The radio frequency module 100g according to Modification 1 is different from the radio frequency module 100f according to Embodiment 4 in that a plurality of external connection terminals 8 are ball bumps. In addition, the radio frequency module 100g according to Modification 1 is different from the radio frequency module 100f according to Embodiment 4 in that the second resin layer 109 of the radio frequency module 100f according to Embodiment 4 is not provided. The radio frequency module 100g according to Modification 1 may be provided with an underfill portion provided in a gap between the IC chip 29 mounted on the second main surface 102 of the mounting substrate 10 and the second main surface 102 of the mounting substrate 10.

A material of the ball bump constituting each of a plurality of external connection terminals 8 is, for example, gold, copper, solder, or the like.

The plurality of external connection terminals 8 may be configured by a mixture of the external connection terminals 8 configured by ball bumps and the external connection terminals 8 formed in a cylindrical shape.

Embodiment 5

A radio frequency module 100h according to Embodiment 5 will be described with reference to FIG. 12. Regarding the radio frequency module 100h according to Embodiment 5, constituent elements the same as or similar to those of the radio frequency module 100 according to Embodiment 1 are denoted by the same signs and description thereof is omitted.

The radio frequency module 100h according to Embodiment 5 is different from the radio frequency module 100 according to Embodiment 1 in that the first electronic component 201 is the reception filter 43 and the second electronic component 202 is a filter 44. Additionally, the radio frequency module 100h according to Embodiment 5 differs from the radio frequency module 100 according to Embodiment 1 in that the main surface 221 of the second electronic component 202 is in contact with the inner surface 1711 of the first portion 171 of the second metal layer 107.

In the radio frequency module 100h according to Embodiment 5, the first electronic component 201 is mounted in the first region 401 of the first main surface 101 of the mounting substrate 10. The first electronic component 201 is, for example, the reception filter 43. In addition, in the radio frequency module 100h according to Embodiment 5, the second electronic component 202 is mounted in the second region 402 of the first main surface 101 of the mounting substrate 10. The second electronic component 202 is the filter 44 to be used at least for transmission of a radio frequency signal, for example. In the radio frequency module 100*h* according to Embodiment 5, the filter 44 is used for transmission and reception of radio frequency signals.

In the radio frequency module 100*h* according to Embodiment 5, the first metal layer 106 is disposed over the entirety of the first region 401 of the first main surface 101 of the mounting substrate 10 in which the first electronic component 201 is mounted. Additionally, in the radio frequency module 100*h* according to Embodiment 5, the metal member 108 is disposed between the first electronic component 201 and the second electronic component 202 on the first main surface 101 of the mounting substrate 10. The first metal layer 106 is in contact with the inner peripheral surface 1721 of the second portion 172 of the second metal layer 107 at the first end portion 161, and is in contact with the second end portion 182 of the metal member 108 at the second end portion 162. Additionally, the metal member 108 is in contact with the inner surface 1711 of the first portion 171 of the second metal layer 107 at the first end portion 181. In the radio frequency module 100*h* according to Embodiment 5, the first electronic component 201 is disposed in the space SP1 surrounded by the first metal layer 106, the second metal layer 107, and the metal member 108. That is, in the radio frequency module 100*h* according to Embodiment 5, the reception filter 43 constituted by the first electronic component 201 is disposed in the space SP1.

Figure 12:
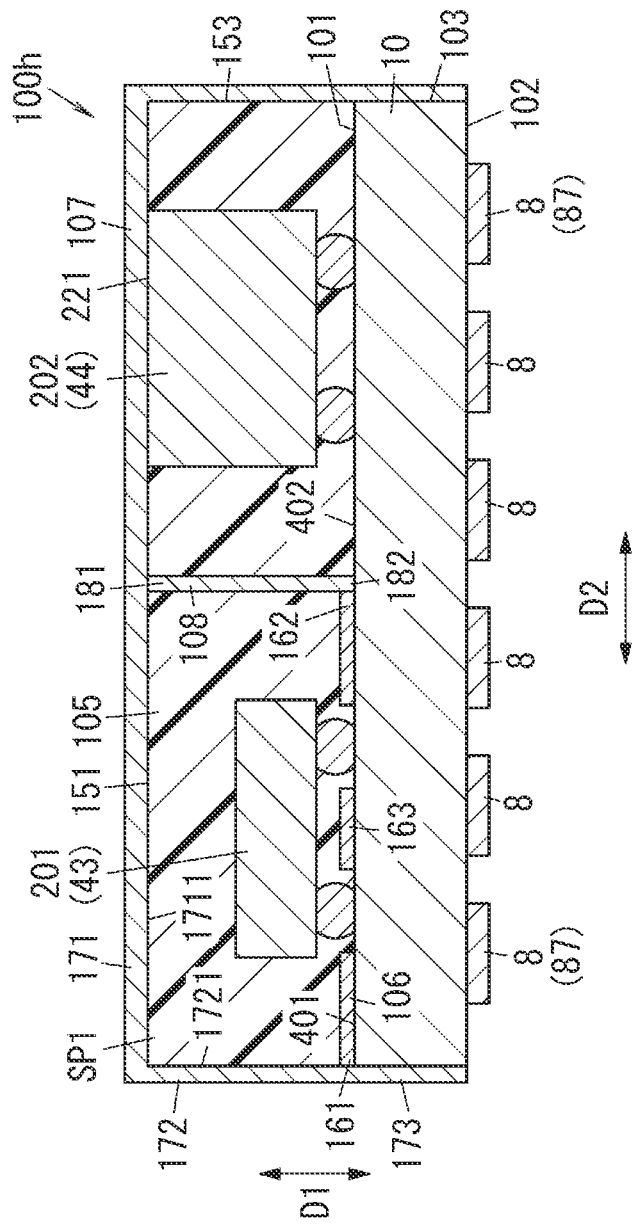
FIG. 12 is a cross-sectional view of a radio frequency module according to Embodiment 5.

Additionally, in the radio frequency module 100*h* according to Embodiment 5, as illustrated in FIG. 12, the main surface 221 of the second electronic component 202 on the side opposite to the mounting substrate 10 side is in contact with the inner surface 1711 of the first portion 171 of the second metal layer 107. Thus, heat generated by the second electronic component 202 can be dissipated to the outside (for example, the circuit board described above) through the second metal layer 107.

In the radio frequency module 100*h* according to Embodiment 5, as described above, the first electronic component 201 and the second electronic component 202 are separated from each other by the metal member 108. The metal member 108 is in contact with the inner surface 1711 of the first portion 171 of the second metal layer 107 at the first end portion 181, and is in contact with the first metal layer 106 at the second end portion 182. In addition, the first metal layer 106 is in contact with the inner peripheral surface 1721 of the second portion 172 of the second metal layer 107 at the first end portion 161. This can improve the isolation between the first electronic component 201 and the second electronic component 202 as compared with a case where the metal member is in contact with only the second metal layer.

Although the reception filter 43 is disposed in the space SP1 in the radio frequency module 100*h* according to Embodiment 5, for example, the filter 44 may be disposed in the space SP1 instead of the reception filter 43. In short, the reception filter 43 or the filter 44 may be disposed in the space SP1. In addition, the filter 44 may be a filter to be used at least for reception of a radio frequency signal.

Embodiment 6

Figure 13:
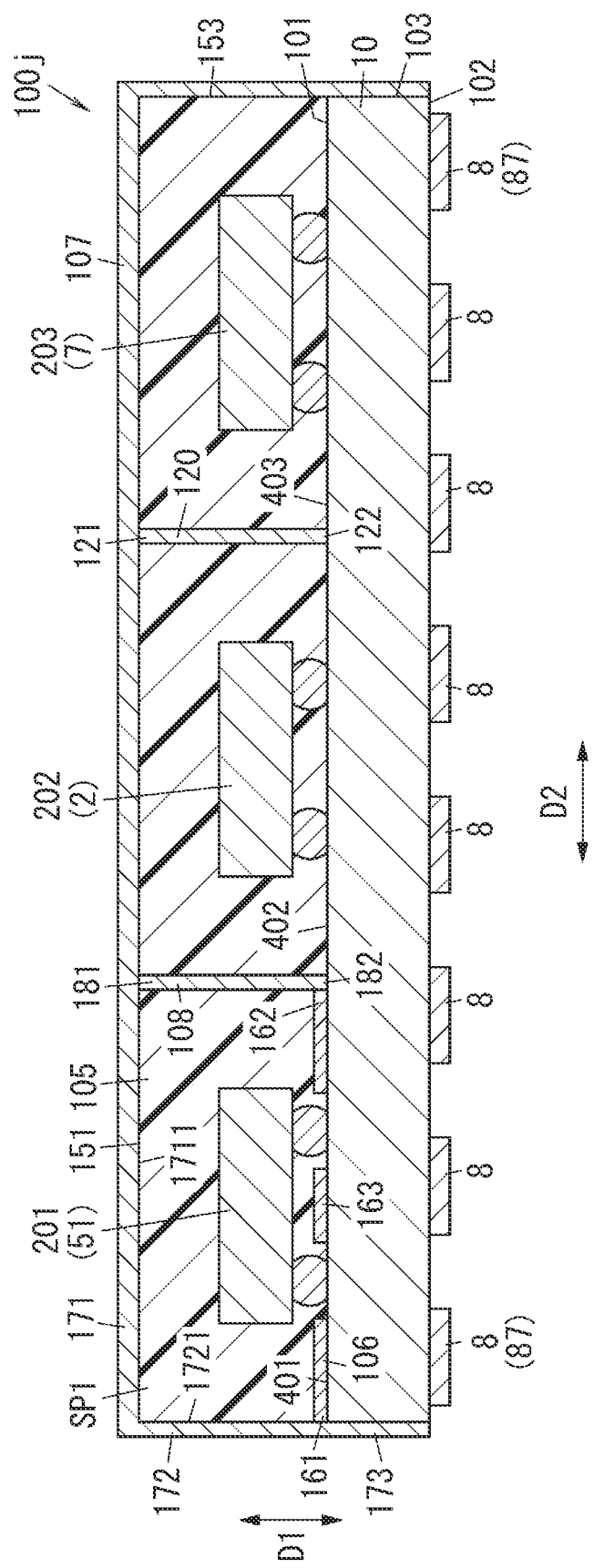
FIG. 13 is a cross-sectional view of a radio frequency module according to Embodiment 6.

A radio frequency module 100*j* according to Embodiment 6 will be described with reference to FIG. 13. Regarding the radio frequency module 100*j* according to Embodiment 6, constituent elements the same as or similar to those of the radio frequency module 100 according to Embodiment 1 are denoted by the same signs, and description thereof is omitted. Note that a circuit configuration of the radio frequency module 100*j* is the same as or similar to the circuit configuration of the radio frequency module 100 according to Embodiment 1 described with reference to FIG. 4.

The radio frequency module 100*j* according to Embodiment 6 is different from the radio frequency module 100 according to Embodiment 1 in that the third electronic component 203 is mounted on the first main surface 101 of the mounting substrate 10.

In the radio frequency module 100*j* according to Embodiment 6, the first electronic component 201, the second electronic component 202, and the third electronic component 203 are mounted on the first main surface 101 of the mounting substrate 10. More specifically, the first electronic component 201 is mounted in the first region 401 of the first main surface 101 of the mounting substrate 10. Additionally, the second electronic component 202 is mounted in the second region 402 of the first main surface 101 of the mounting substrate 10. Additionally, the third electronic component 203 is mounted in the third region 403 of the first main surface 101 of the mounting substrate 10. The first electronic component 201 is, for example, the transmission filter 51 of the second filter 5 (see FIG. 4). The second electronic component 202 is, for example, the second power amplifier 2. The third electronic component 203 is, for example, the third switch 7.

In the radio frequency module 100*j* according to Embodiment 6, a first metal member 108 is disposed between the first electronic component 201 and the second electronic component 202 on the first main surface 101 of the mounting substrate 10. In addition, in the radio frequency module 100*j* according to Embodiment 6, a second metal member 120 is disposed between the second electronic component 202 and the third electronic component 203 on the first main surface 101 of the mounting substrate 10. That is, in the radio frequency module 100*j* according to Embodiment 6, the first metal member 108 separates the first electronic component 201 and the second electronic component 202, and the second metal member 120 separates the second electronic component 202 and the third electronic component 203.

Additionally, in the radio frequency module 100*j* according to Embodiment 6, the first metal layer 106 is disposed over the entirety of the first region 401 of the first main surface 101 of the mounting substrate 10 in which the first electronic component 201 is mounted. The first metal layer 106 is in contact with the inner peripheral surface 1721 of the second portion 172 of the second metal layer 107 at the first end portion 161, and is in contact with the second end portion 182 of the first metal member 108 at the second end portion 162. Furthermore, the first metal member 108 is in contact with the inner surface 1711 of the first portion 171 of the second metal layer 107 at the first end portion 181.

In the radio frequency module 100*j* according to Embodiment 6, the first metal member 108 separating the first electronic component 201 and the second electronic component 202 is in contact with the inner surface 1711 of the first portion 171 of the second metal layer 107 at the first end portion 181, and in contact with the second end portion 162 of the first metal layer 106 at the second end portion 182. In addition, in the radio frequency module 100*j* according to Embodiment 6, the first end portion 161 of the first metal layer 106 is in contact with the inner peripheral surface 1721 of the second portion 172 of the second metal layer 107. This can improve isolation between the first electronic component 201 and the second electronic component 202 as compared to a case where the first metal member is in contact with only the second metal layer.

Moreover, in the radio frequency module 100*j* according to Embodiment 6, the second metal member 120 separating the second electronic component 202 and the third electronic component 203 is in contact with the inner surface 1711 of the first portion 171 of the second metal layer 107 at the first end portion 121. This can improve isolation between the second electronic component 202 and the third electronic component 203 as compared to a case where the second metal member is not provided.

Note that in the third region 403 in which the third electronic component 203 is mounted, a first metal layer being in contact with the second metal member 120 and the second metal layer 107 may be provided. This makes it possible to further improve the isolation between the second electronic component 202 and the third electronic component 203.

(Other Modifications)

Each of Embodiments 1 to 6 and the like described above is merely one of various embodiments of the present disclosure. Embodiments 1 to 6 and the like described above can be variously modified in accordance with the design or the like of the present disclosure can be achieved, and different constituent elements from each other of different embodiments from each other may be appropriately combined.

In each of the radio frequency modules 100, 100*a*, 100*b*, 100*c*, 100*d*, 100*e*, 100*f*, 100*g*, 100*h*, and 100*j*, the second metal layer 107 may cover at least a part of the main surface 151 of the resin layer 105, instead of covering the entirety of the main surface 151 of the resin layer 105.

In addition, each of the plurality of transmission filters 41 and 51 and the plurality of reception filters 42 and 52 is not limited to a surface acoustic wave filter and may be, for example, a Bulk Acoustic Wave (BAW) filter. The resonator in the BAW filter is, for example, a film bulk acoustic resonator (FBAR) or a solidly mounted resonator (SMR). The BAW filter includes a substrate. The substrate is, for example, a silicon substrate.

Moreover, each of the plurality of transmission filters 41 and 51 and the plurality of reception filters 42 and 52 is not limited to a ladder-type filter and may be, for example, a longitudinally coupled resonator-type surface acoustic wave filter.

Additionally, the above-described acoustic wave filter is an acoustic wave filter that uses a surface acoustic wave or a bulk acoustic wave, but is not limited thereto. For example, the above-described acoustic wave filter may be an acoustic wave filter that uses a boundary acoustic wave, a plate wave, or the like.

The circuit configuration of each of the radio frequency modules 100 to 100*j* is not limited to the example in FIG. 4 described above. Further, each of the radio frequency modules 100 to 100*j* may include, for example, a radio frequency front-end circuit supporting multi-input multi-output (MIMO) as a circuit configuration.

In addition, the communication device 300 according to Embodiment 1 may include any one of the radio frequency modules 100*a*, 100*b*, 100*c*, 100*d*, 100*e*, 100*f*, 100*g*, 100*h*, and 100*j* instead of the radio frequency module 100.

In the radio frequency module 100 according to Embodiment 1, the first electronic component 201 is the transmission filter 51 of the second filter 5, but is not limited thereto. The first electronic component 201 may be, for example, the reception filter 52 of the second filter 5, may be the transmission filter 41 of the first filter 4, or may be the reception filter 42 of the first filter 4. Further, in the radio frequency module 100 according to Embodiment 1, the second electronic component 202 is the second power amplifier 2, but is not limited thereto. The second electronic component 202 may be, for example, the first power amplifier 1.

In each of Embodiments 1 to 6 and the like, all of the first metal layer 106, the second metal layer 107, and the metal member 108 are separate bodies. However, for example, two or more of the first metal layer 106, the second metal layer 107, and the metal member 108 may be integrated.

(Aspects)

The following aspects are disclosed in the present specification.

A radio frequency module (100; 100*a* to 100*j*) according to a first aspect includes a mounting substrate (10), a first electronic component (201) and a second electronic component (202), a metal member (108), a first metal layer (106), a resin layer (105), and a second metal layer (107). The mounting substrate (10) includes a first main surface (101) and a second main surface (102) that are opposed to each other. The first electronic component (201) and the second electronic component (202) are mounted on the first main surface (101) of the mounting substrate (10). The metal member (108) is disposed between the first electronic component (201) and the second electronic component (202) on the first main surface (101) of the mounting substrate (10). The first metal layer (106) is disposed on the first main surface (101) of the mounting substrate (10). The resin layer (105) is disposed on the first main surface (101) of the mounting substrate (10). The second metal layer (107) covers at least a part of the resin layer (105). The resin layer (105) covers at least a part of the first electronic component (201), covers at least a part of the second electronic component (202), covers an outer peripheral surface (108) of the metal member (108), and covers the first metal layer (106). The first metal layer (106) has a ground potential, and is in contact with the second metal layer (107). The metal member (108) is in contact with the first metal layer (106) and the second metal layer (107).

According to this aspect, isolation between the first electronic component (201) and the second electronic component (202) can be improved.

In a radio frequency module (100; 100*a* to 100*j*) according to a second aspect, in the first aspect, the first metal layer (106) overlaps the first electronic component (201) in plan view from a thickness direction (D1) of the mounting substrate (10).

According to this aspect, isolation between the first electronic component (201) and a wiring line (a conductive pattern portion 112) in the mounting substrate (10) can be improved.

A radio frequency module (100*a*) according to a third aspect further includes, in the second aspect, an inductor (310). The inductor (310) is incorporated in the mounting substrate (10). The first electronic component (201) is a filter (51). The first metal layer (106) is positioned between the filter (51) and the inductor (310).

According to this aspect, isolation between the filter (51) and the inductor (310) can be improved.

In a radio frequency module (100*a*) according to a fourth aspect, in the third aspect, the mounting substrate (10) includes a conductor layer (112) adjacent to the first metal layer (106) in the thickness direction (D1) of the mounting substrate (10). The conductor layer (112) is connected to the filter (51). The first metal layer (106) does not overlap the conductor layer (112) in plan view from the thickness direction (D1) of the mounting substrate (10).

According to this aspect, a parasitic capacitance generated between the first metal layer (106) and the conductor layer (112) can be suppressed.

In a radio frequency module (100a) according to a fifth aspect, in the third or fourth aspect, the filter (51) includes a piezoelectric substrate (510) and an IDT electrode (515). The piezoelectric substrate (510) includes a third main surface (511) and a fourth main surface (512) that are opposed to each other. The IDT electrode (515) is mounted on the third main surface (511) of the piezoelectric substrate (510). The filter (51) is mounted on the first main surface (101) of the mounting substrate (10) in a manner that the third main surface (511) of the piezoelectric substrate (510) is positioned on the first main surface (101) side of the mounting substrate (10).

According to this aspect, isolation between the IDT electrode (515) and the inductor (310) can be improved.

In a radio frequency module (100a to 100c) according to a sixth aspect, in any one of the third to fifth aspects, the first metal layer (106) does not overlap the inductor (310) in plan view from the thickness direction (D1) of the mounting substrate (10).

According to this aspect, a parasitic capacitance generated between the first metal layer (106) and the inductor (310) can be suppressed.

In a radio frequency module (100h) according to a seventh aspect, in the first or second aspect, the first electronic component (201) is a reception filter (43). The second electronic component (202) is a filter (44) configured to be used at least for transmission of a radio frequency signal.

According to this aspect, isolation between the reception filter (43) and the filter (44) can be improved.

In a radio frequency module (100h) according to an eighth aspect, in the seventh aspect, the reception filter (43) or the filter (44) is disposed in a space (SP1) surrounded by the metal member (108), the first metal layer (106), and the second metal layer (107).

According to this aspect, when the reception filter (43) is disposed in the space (SP1), the reception filter (43) is less likely to be affected by heat generated by the filter (44). In addition, when the filter (44) is disposed in the space (SP1), the heat generated by the filter (44) is less likely to be radiated to the outside.

In a radio frequency module (100h) according to a ninth aspect, in the eighth aspect, the reception filter (43) is disposed in the space (SP1).

A radio frequency module (100f; 100g) according to a tenth aspect further includes, in the first or second aspect, an antenna terminal (81, 82) and a switch (7). The switch (7) is connected to the antenna terminal (81, 82), and is mounted on the second main surface (102) of the mounting substrate (10). Each of the first electronic component (201) and the second electronic component (202) is a filter configuring a multiplexer (33). Each of the first electronic component (201) and the second electronic component (202) overlaps the switch (7) in plan view from the thickness direction (D1) of the mounting substrate (10).

According to this aspect, a wiring length between each of the first electronic component (201) and the second electronic component (202) and the switch (7) can be shortened.

A radio frequency module (100j) according to an eleventh aspect further includes, in any one of the first to tenth aspects, a third electronic component (203) and a second metal member (120). The third electronic component (203) is mounted on the first main surface (101) of the mounting substrate (10). Unlike the first metal member (108) serving as the metal member, the second metal member (120) is disposed between the first electronic component (201) or the second electronic component (202) and the third electronic component (203) on the first main surface (101) of the mounting substrate (10).

According to this aspect, isolation between the first electronic component (201) or the second electronic component (202) and the third electronic component (203) can be improved.

A communication device (300) according to a twelfth aspect includes the radio frequency module (100, 100a to 100h) according to any one of the first to eleventh aspects and a signal processing circuit (301). The signal processing circuit (301) is connected to the radio frequency module (100, 100a to 100j).

According to this aspect, isolation between the first electronic component (201) and the second electronic component (202) can be improved.

REFERENCE SIGNS LIST

1 FIRST POWER AMPLIFIER
2 SECOND POWER AMPLIFIER
3 FIRST SWITCH
4, 4A, 4B FIRST FILTER
5 SECOND FILTER
6 SECOND SWITCH
7 THIRD SWITCH
8 EXTERNAL CONNECTION TERMINAL
9 LOW-NOISE AMPLIFIER
10 MOUNTING SUBSTRATE
11 FIRST INPUT TERMINAL
12 FIRST OUTPUT TERMINAL
13 FIRST OUTPUT MATCHING CIRCUIT
14 SECOND OUTPUT MATCHING CIRCUIT
15, 15A, 15B FIRST MATCHING CIRCUIT
16 SECOND MATCHING CIRCUIT
17 FIRST LOW-PASS FILTER
18 SECOND LOW-PASS FILTER
19 INPUT MATCHING CIRCUIT
20 CONTROLLER
21 SECOND INPUT TERMINAL
22 SECOND OUTPUT TERMINAL
23 FOURTH SWITCH
24 FIFTH SWITCH
25 SIXTH SWITCH
26, 27, 28 MATCHING CIRCUIT
29 IC CHIP
30 COMMON TERMINAL
31, 31A, 31B SELECTION TERMINAL
32 SELECTION TERMINAL
33 MULTIPLEXER
41 TRANSMISSION FILTER
42 RECEPTION FILTER
43 RECEPTION FILTER
44 FILTER
51 TRANSMISSION FILTER
52 RECEPTION FILTER
60 COMMON TERMINAL
61 SELECTION TERMINAL
70A FIRST COMMON TERMINAL
70B SECOND COMMON TERMINAL
71 FIRST SELECTION TERMINAL
72 SECOND SELECTION TERMINAL
81 FIRST ANTENNA TERMINAL
82 SECOND ANTENNA TERMINAL
83 FIRST SIGNAL INPUT TERMINAL
84 SECOND SIGNAL INPUT TERMINAL

85 CONTROL TERMINAL
86 SIGNAL OUTPUT TERMINAL
87 GROUND TERMINAL
100, 100a to 100j RADIO FREQUENCY MODULE
101 FIRST MAIN SURFACE
102 SECOND MAIN SURFACE
103 OUTER PERIPHERAL SURFACE
105 RESIN LAYER (FIRST RESIN LAYER)
106 FIRST METAL LAYER
107 SECOND METAL LAYER
108 METAL MEMBER (FIRST METAL MEMBER)
109 SECOND RESIN LAYER
110 FIRST BUMP
111 VIA CONDUCTOR
112 CONDUCTIVE PATTERN PORTION
113 GROUND LAYER
120 SECOND METAL MEMBER
121 FIRST END PORTION
122 SECOND END PORTION
151 MAIN SURFACE
153 OUTER PERIPHERAL SURFACE
161 FIRST END PORTION
162 SECOND END PORTION
163 INTERMEDIATE PORTION
171 FIRST PORTION
172 SECOND PORTION
173 THIRD PORTION
174 FOURTH PORTION
175 FIFTH PORTION
181 FIRST END PORTION
182 SECOND END PORTION
183 OUTER PERIPHERAL SURFACE
191 MAIN SURFACE
193 OUTER PERIPHERAL SURFACE
201 FIRST ELECTRONIC COMPONENT
202 SECOND ELECTRONIC COMPONENT
203 THIRD ELECTRONIC COMPONENT
204 FOURTH ELECTRONIC COMPONENT
213 OUTER PERIPHERAL SURFACE
220 BUMP
221 MAIN SURFACE
223 OUTER PERIPHERAL SURFACE
230 COMMON TERMINAL
231 SELECTION TERMINAL
240 COMMON TERMINAL
241 SELECTION TERMINAL
250 FIRST TERMINAL
251 SECOND TERMINAL
301 SIGNAL PROCESSING CIRCUIT
302 RF SIGNAL PROCESSING CIRCUIT
303 BASEBAND SIGNAL PROCESSING CIRCUIT
310 INDUCTOR
311 FIRST ANTENNA
312 SECOND ANTENNA
401 FIRST REGION
402 SECOND REGION
403 THIRD REGION
404 FOURTH REGION
510 FIRST SUBSTRATE (PIEZOELECTRIC SUBSTRATE)
511 THIRD MAIN SURFACE
512 FOURTH MAIN SURFACE
514 FIRST CIRCUIT UNIT
515 IDT ELECTRODE
516 FIRST PAD ELECTRODE
1631 FIRST INTERMEDIATE PORTION
1632 SECOND INTERMEDIATE PORTION
1633 THIRD INTERMEDIATE PORTION
1711 INNER SURFACE
1721 INNER PERIPHERAL SURFACE
1741 INNER SURFACE
1751 INNER PERIPHERAL SURFACE
D1 THICKNESS DIRECTION
D2 LONGITUDINAL DIRECTION
D3 WIDTH DIRECTION
H1, H2 INTERVAL
L1, L2 LENGTH
P1, P2 WINDING SHAFT
SP1 SPACE

The invention claimed is:

1. A radio frequency module comprising:
a mounting substrate including a first main surface and a second main surface that are opposed to each other in a thickness direction;
a first electronic component and a second electronic component that are mounted on the first main surface of the mounting substrate;
a piece of metal between the first electronic component and the second electronic component on the first main surface of the mounting substrate;
a first metal layer on the first main surface of the mounting surface;
a resin layer on the first main surface of the mounting surface;
a second metal layer covering at least a part of the resin layer; and
an inductor incorporated in the mounting substrate,
wherein the resin layer covers at least a part of the first electronic component, covers at least a part of the second electronic component, covers an outer peripheral surface of the piece of metal, and covers the first metal layer,
wherein the first metal layer is at a ground potential, and is in contact with the second metal layer,
wherein the piece of metal is in contact with the first metal layer and the second metal layer,
wherein the first metal layer overlaps the first electronic component in a plan view from the thickness direction,
wherein the first electronic component is a filter,
wherein the first metal layer is between the filter and the inductor,
wherein the filter comprises:
a piezoelectric substrate including a third main surface and a fourth main surface that are opposed to each other; and
an interdigital transducer (IDT) electrode mounted on the third main surface of the piezoelectric substrate,
wherein the filter is mounted on the first main surface of the mounting substrate, and
wherein the third main surface of the piezoelectric substrate is on the first main surface side of the mounting substrate.

2. The radio frequency module according to claim 1, wherein the mounting substrate comprises a conductor layer adjacent to the first metal layer in the thickness direction,
wherein the conductor layer is connected to the filter, and
wherein the first metal layer does not overlap the conductor layer in the plan view.

3. The radio frequency module according to claim 1, wherein the first metal layer does not overlap the inductor in the plan view.

4. The radio frequency module according to claim 1, wherein the filter is a reception filter, and wherein the second electronic component is a transmission filter.

5. The radio frequency module according to claim 4, wherein the reception filter or the transmission filter is surrounded by the piece of metal, the first metal layer, and the second metal layer.

6. The radio frequency module according to claim 5, wherein the reception filter is surrounded by the piece of metal, the first metal layer, and the second metal layer.

7. The radio frequency module according to claim 1, further comprising:
   an antenna terminal; and
   a switch connected to the antenna terminal and mounted on the second main surface of the mounting substrate,
   wherein each of the first electronic component and the second electronic component:
      is a filter of a multiplexer, and
      overlaps the switch in the plan view from the thickness direction.

8. The radio frequency module according to claim 1, further comprising:
   a third electronic component mounted on the first main surface of the mounting substrate; and
   a second piece of metal between the first or second electronic component and the third electronic component on the first main surface of the mounting substrate.

9. A communication device comprising:
   the radio frequency module according to claim 1; and
   a signal processing circuit connected to the radio frequency module.

10. The radio frequency module according to claim 1, wherein the first metal layer directly contacts the second metal layer and the resin covers the first metal layer in the plan view from the thickness direction.

11. The radio frequency module according to claim 1, wherein the first metal layer has a first end portion that contacts the second metal layer, and a second end portion that contacts the piece of metal.

* * * * *